(12) United States Patent
Ohki

(10) Patent No.: US 9,685,547 B2
(45) Date of Patent: Jun. 20, 2017

(54) SEMICONDUCTOR APPARATUS INCLUDING BARRIER FILM PROVIDED BETWEEN ELECTRODE AND PROTECTION FILM

(71) Applicant: FUJITSU LIMITED, Kawasaki-shi, Kanagawa (JP)

(72) Inventor: Toshihiro Ohki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/161,949

(22) Filed: May 23, 2016

(65) Prior Publication Data

US 2016/0268412 A1 Sep. 15, 2016

Related U.S. Application Data

(62) Division of application No. 13/403,329, filed on Feb. 23, 2012, now Pat. No. 9,379,229.

(30) Foreign Application Priority Data

Feb. 24, 2011 (JP) ................................ 2011-038923

(51) Int. Cl.
*H01L 21/338* (2006.01)
*H01L 21/336* (2006.01)
(Continued)

(52) U.S. Cl.
CPC ...... *H01L 29/7787* (2013.01); *H01L 29/2003* (2013.01); *H01L 29/205* (2013.01);
(Continued)

(58) Field of Classification Search
CPC ......... H01L 21/0237; H01L 21/024391; H01L 21/02521; H01L 29/12; H01L 33/26;
(Continued)

(56) References Cited

U.S. PATENT DOCUMENTS 5,796,127 A * 8/1998 Hayafuji ............... H01L 21/314
257/194
6,982,453 B2 1/2006 Kanaya et al.
(Continued)

FOREIGN PATENT DOCUMENTS

JP 53-084465 7/1978
JP 02-084725 3/1990
(Continued)

OTHER PUBLICATIONS

Chinese Office Action dated Sep. 28, 2014 for corresponding Chinese Patent Application No. 201210046433.1, with partial English translation (20 pages).
(Continued)

*Primary Examiner* — Benjamin Sandvik
*Assistant Examiner* — Damon Hillman
(74) *Attorney, Agent, or Firm* — Fujitsu Patent Center

(57) ABSTRACT

A semiconductor apparatus includes a substrate, a semiconductor layer formed above the substrate and including a nitride semiconductor, an electrode formed above the semiconductor layer and including gold, a barrier film formed above the electrode and a protection film formed above the semiconductor layer and including one of a silicon oxide film, a silicon nitride film, and a silicon oxynitride film. The protection film is formed on the barrier film. The barrier film includes a metal oxide material, a metal nitride film, or a metal oxynitride film.

10 Claims, 36 Drawing Sheets

(51) Int. Cl.

| | | |
|---|---|---|
| *H01L 23/48* | (2006.01) | |
| *H01L 21/768* | (2006.01) | |
| *H01L 29/778* | (2006.01) | |
| *H01L 29/20* | (2006.01) | |
| *H01L 29/423* | (2006.01) | |
| *H01L 29/66* | (2006.01) | |
| *H01L 29/205* | (2006.01) | |
| *H01L 29/47* | (2006.01) | |
| *H02M 3/335* | (2006.01) | |
| *H03F 1/32* | (2006.01) | |
| *H03F 3/19* | (2006.01) | |
| *H03F 3/24* | (2006.01) | |

(52) U.S. Cl.
CPC ...... *H01L 29/42316* (2013.01); *H01L 29/475* (2013.01); *H01L 29/66462* (2013.01); *H02M 3/33507* (2013.01); *H03F 1/3241* (2013.01); *H03F 3/19* (2013.01); *H03F 3/245* (2013.01); *H03F 2200/451* (2013.01)

(58) Field of Classification Search
CPC ............. H01L 31/0256; H01L 29/7787; H01L 29/2003; H01L 29/475; H01L 29/205; H01L 29/66462
See application file for complete search history.

(56) References Cited

U.S. PATENT DOCUMENTS

| | | | | |
|---|---|---|---|---|
| 7,821,036 | B2* | 10/2010 | Ehara | ................ H01L 21/28229 257/192 |
| 8,212,290 | B2 | 7/2012 | Heikman et al. | |
| 2006/0197107 | A1* | 9/2006 | Kanamura | .......... H01L 29/7787 257/194 |
| 2007/0278518 | A1 | 12/2007 | Chen et al. | |
| 2007/0284653 | A1 | 12/2007 | Ueno et al. | |
| 2008/0230786 | A1* | 9/2008 | Heikman | ............... H01L 29/402 257/76 |
| 2009/0140262 | A1 | 6/2009 | Ohki et al. | |
| 2010/0237384 | A1 | 9/2010 | Choo | |
| 2011/0049574 | A1 | 3/2011 | Ueno et al. | |
| 2012/0074426 | A1 | 3/2012 | Ohki et al. | |
| 2013/0082400 | A1* | 4/2013 | Ohki | ................. H01L 29/66462 257/774 |
| 2013/0228795 | A1* | 9/2013 | Ohki | ................... H01L 29/0653 257/76 |

FOREIGN PATENT DOCUMENTS

| | | |
|---|---|---|
| JP | 5-136126 | 6/1993 |
| JP | 05-211242 | 8/1993 |
| JP | 10-092765 | 4/1998 |
| JP | 2002-016086 | 1/2002 |
| JP | 2002-359256 | 12/2002 |
| JP | 2008-171997 | 7/2008 |
| JP | 2008-306026 | 12/2008 |
| JP | 2009-054807 | 3/2009 |
| JP | 2010-147349 A | 7/2010 |
| WO | 2008/035403 | 3/2008 |

OTHER PUBLICATIONS

Japanese Office Action mailed on Dec. 2, 2014 for corresponding Japanese Patent Application No. 2011-038923, with partial English translation (4 pages).
Japanese Office Action mailed on Sep. 15, 2015 for corresponding Japanese Patent Application No. 2011-038923, with English translation (5 pages).
Japanese Office Action mailed on Mar. 1, 2016 for corresponding Japanese Patent Application No. 2011-038923, with partial English translation (6 pages).
USPTO, (Hillman) Corrected Notice of Allowability, Mar. 15, 2016, in parent U.S. Appl. No. 13/403,329 [pending].
USPTO, (Hillman) Notice of Allowance and Notice of Allowability, Feb. 29, 2016, in parent U.S. Appl. No. 13/403,329 [pending].
USPTO, (Hillman) Non-Final Rejection, Nov. 4, 2015, in parent U.S. Appl. No. 13/403,329 [pending].
USPTO, (Hillman) Non-Final Rejection, Aug. 1, 2014, in parent U.S. Appl. No. 13/403,329 [pending].
USPTO, (Hillman) Final Rejection, Dec. 20, 2013, in parent U.S. Appl. No. 13/403,329 [pending].
USPTO, (Hillman) Non-Final Rejection, May 24, 2013, in parent U.S. Appl. No. 13/403,329 [pending].
USPTO, (Hillman) Restriction Requirement, Apr. 11, 2013, in parent U.S. Appl. No. 13/403,329 [pending].
Japanese Office Action mailed Nov. 15, 2016 for corresponding Japanese Patent Application No. 2015-243518, with Partial English Translation, 6 pages.
Japanese Office Action mailed Nov. 15, 2016 for corresponding Japanese Patent Application No. 2015-22093, with Partial English Translation, 31 pages.
Japanese Office Action mailed Nov. 15, 2016 for corresponding Japanese Patent Application No. 2011-38923, with Partial English Translation, 31 pages.

* cited by examiner

SEMICONDUCTOR APPARATUS INCLUDING BARRIER FILM PROVIDED BETWEEN ELECTRODE AND PROTECTION FILM

CROSS-REFERENCE TO RELATED APPLICATIONS

This application is a divisional of application Ser. No. 13/403,329, filed Feb. 23, 2012, which is based upon and claims the benefit of priority of the prior Japanese Patent Application No. 2011-038923 filed on Feb. 24, 2011, the entire contents of which are incorporated herein by reference.

FIELD

The embodiments discussed herein are generally related to a semiconductor apparatus and a method for manufacturing the semiconductor apparatus.

BACKGROUND

A nitride semiconductor such as GaN, AlN, InN or a material containing mixed crystals of the nitride semiconductor has a wide band gap and is used for high output electronic devices, short-wavelength illumination devices, and the like. Among the high output electronic devices, technology related to FET (Field Effect Transistor) (particularly, HEMT, High Electron Mobility Transistor) is being developed. A HEMT using a nitride semiconductor is used in, for example, a high output/high efficiency amplifier or a high electric power switching device.

In order to attain a normally-off property, a HEMT used in such devices may include a structure having a gate recess formed by removing a part of a semiconductor layer immediately below a gate electrode. Further, there is also a HEMT including a MIS (Metal Insulator Semiconductor) structure having an insulator film formed as a gate insulator film.

For the purpose of passivation or the like, a semiconductor apparatus such as the above-described FET has a protection film made of an insulating material formed on the entire surface thereof after forming, for example, a source electrode and a drain electrode thereon.

Patent Document 1: Japanese Laid-Open Patent Publication No. 2002-359256
Patent Document 2: Japanese Laid-Open Patent Publication No. 5-136126
Patent Document 3: Japanese Laid-Open Patent Publication No. 2008-306026

Normally, a silicon compound (e.g., silicon nitride (SiN), silicon oxide ($SiO_2$)) is used as the protection film of, for example, a HEMT formed of a nitride semiconductor. The silicon compound used as the protection film has a high insulating property and a low dielectric constant and can be formed relatively easily. Further, gold (Au) is used as a gate electrode of the HEMT. The gold used as the gate electrode has high electromigration resistance and can reduce resistance of the gate electrode. Accordingly, the HEMT is configured having a protection film made of a silicon compound formed on a gate electrode made of gold.

However, a eutectic crystal of gold and silicon tends to be formed at a portion of the HEMT where gold and silicon contact each other. The forming of the eutectic crystal results in problems such as degradation of insulation property and increase of resistance at the gate electrode. Because the eutectic temperature of gold and silicon is a relatively low temperature of approximately 370° C., a eutectic crystal of gold and silicon (gold-silicon eutectic) tend to be formed during manufacture of a semiconductor apparatus or use of the semiconductor apparatus. Thereby, increase of the resistance of the gate electrode and degradation of insulation resistance tend to occur when the gold-silicon eutectic is formed. Particularly, parts of a high output electric device may locally become high temperature. Thus, the gold-silicon eutectic is easily formed in the high output electric device according to the environment or status in which the high output electric device is used. Hence, the forming of the gold-silicon eutectic results in the degradation of reliability of the semiconductor apparatus.

SUMMARY

According to an aspect of the invention, there is provided a semiconductor apparatus including: a substrate; a semiconductor layer formed above the substrate and including a nitride semiconductor; an electrode formed above the semiconductor layer and including gold; a barrier film formed above the electrode; and a protection film formed above the semiconductor layer and including one of a silicon oxide film, a silicon nitride film, and a silicon oxynitride film; wherein the protection film is formed on the barrier film; wherein the barrier film includes a metal oxide material, a metal nitride film, or a metal oxynitride film.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

First Embodiment

Semiconductor Apparatus

The formation of a gold-silicon eutectic can be prevented by forming a gate electrode by using a material other than gold or by forming a protection film by using a material other than a silicon compound. However, it is practical to use a silicon compound (e.g., $SiO_2$, SiN) for the protection film owing to the properties of the silicon compound. Likewise, it is practical and preferable to use gold or a gold alloy for the gate electrode owing to the properties of gold.

Figure 1:
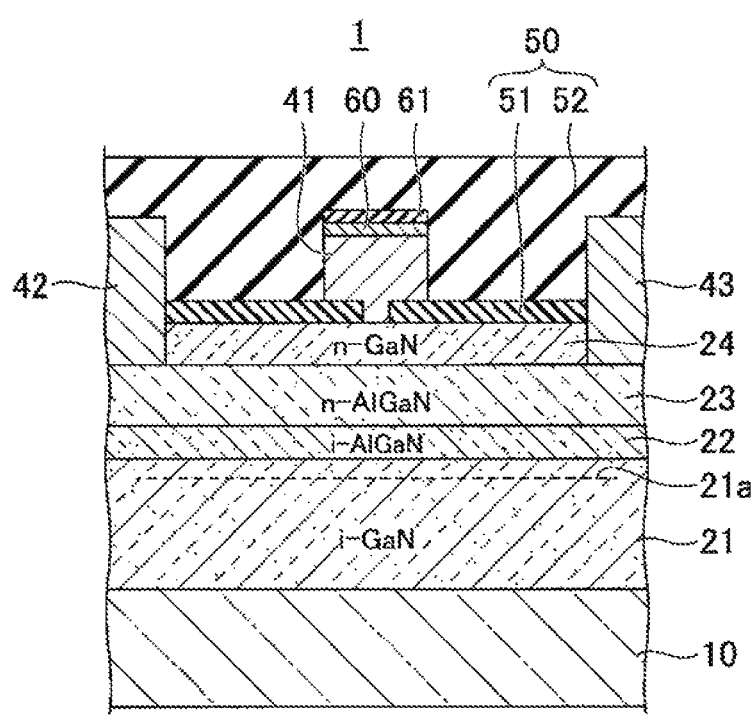
FIG. 1 is a schematic diagram illustrating a configuration of a semiconductor apparatus according to the first embodiment of the present invention.

Next, a semiconductor apparatus according to the first embodiment of the present invention is described with reference to FIG. 1. The semiconductor apparatus 1 according to an embodiment of the present invention is a HEMT (High Electron Mobility Transistor). In the semiconductor apparatus 1, a buffer layer (not illustrated) is formed on a surface of a substrate 10 made of, for example, a semiconductor material. A semiconductor layer having a layered configuration including an electron transit layer 21, a spacer layer 22, an electron supply layer 23, and a cap layer 24 is formed on the buffer layer by epitaxial growth. An insulation film 51 having an opening is formed on the cap layer 24. A gate electrode 41 is formed in the opening of the insulation film 51 and is in contact with the cap layer 24. Although a source electrode 42 and a drain electrode 43 are formed in contact with the electron supply layer 23 in the embodiment illustrated in FIG. 1, the source electrode 42 and the drain electrode 43 may be formed in contact with the electron transit layer 21. A gate electrode protection film 60 made of a metal material and a barrier film 61 made of an oxide or the like of the metal of the gate electrode protection film 60 are formed on a top part of the gate electrode 41. An insulation film 52 is formed on, for example, an exposed part of the insulation film 51 and the barrier film 61. The insulation film 51 and the insulation film 52 constitute a protection film 50.

For example, a Si substrate or a sapphire ($Al_2O_3$) substrate may be used as the substrate 10. In this embodiment, a SiC substrate having a semiconductor property is used as the substrate 10. The electron transit layer 21, which acts as a first semiconductor layer, is made of i-GaN. The spacer layer 22 is made of i-ALGaN. The electron supply layer 23, which acts as a second semiconductor layer, is made of n-AlGaN. The cap layer 24 is made of n-GaN. Thereby, a secondary electron gas (2DEG) 21a is formed in a part of the electron transit layer 21 on a side toward the electron supply layer 23.

The gate electrode 41 is formed of gold or a gold alloy. The source electrode 42 and the drain electrode 43 are made of a metal material. Further, the insulation films 51, 52 constituting the protection film 50 are both made of SiN. Although the protection film 50 may be made of an oxide or an oxinitride of a silicon material, it is preferable for the protection film 50 to be made of SiN considering the aspects of adhesive strength and electric property of SiN.

The gate electrode protection film 60 and the barrier film 61 are formed to prevent gold and silicon from directly contacting each other. The barrier film 61 is made of, for example, an oxide, a nitride, or an oxinitride of a metal material. It is preferable for the barrier film 61 to be formed of a material having a barricading property that prevents gold and silicon from entering. The material of the barrier film 61 may be an oxide, a nitride, or an oxinitride of one or more metal materials selected from, for example, Al, Ti, Ta, W, Mo, Hf, Ni, and Zr. Likewise, it is preferable for the material of the gate electrode protection film 60 to be one or more metal materials selected from, for example, Al, Ti, Ta, W, Mo, Hf, Ni, and Zr. In a case where the material of the barrier film 61 is an oxide of the material forming the gate electrode protection film 60, the manufacturing process of the semiconductor apparatus 1 can be simplified and manufacture cost can be reduced because the barrier film 61 can be formed by oxidizing the surface of the gate electrode protection film 60. Therefore, it is preferable to form the barrier film 61 with an oxide of the material forming the gate electrode protection film 60. Although the semiconductor apparatus 1 according to the embodiment illustrated in FIG. 1 includes both the gate electrode protection film 60 and the barrier film 61, the semiconductor apparatus 1 may be formed with only the barrier film 61, for example, by oxidizing the entire gate electrode protection film 60. The gate electrode protection film 60 has a strong adhesive strength with respect to the gate electrode 41 because both the gate electrode 41 and the gate electrode protection film 60 are made of a metal material. The barrier film 61, which is formed by, for example, oxidizing the gate electrode protection film 60, has a strong adhesive strength with respect to the gate electrode protection film 60 because a same element(s) is contained in both the barrier film 60 and the gate electrode protection film 61. Accordingly, compared to a case of depositing the barrier film 61 (including, for example, an insulating film) directly on the gate electrode 41, a stronger adhesive strength can be attained and peeling or the like becomes more difficult by forming the barrier film 61 via the gate electrode protection film 60. In this embodiment, the gate electrode protection film 60 is made of titanium, and the barrier film 61 is made of a titanium oxide.

By forming the gate electrode protection film 60 and the barrier film 61, the gold included in the gate electrode 41 and the silicon included in the insulation film 52 can be prevented from contacting each other. Thereby, the formation of gold-silicon eutectic can be prevented. As a result, a highly reliable semiconductor apparatus 1 can be manufactured.

Although the above-described embodiment is applied to a case where the gate electrode 41 is made of a material containing gold, the above-described embodiment may also be applied to a case where the source electrode 42 and the drain electrode 43 are formed of a material containing gold. In other words, substantially the same advantages can be attained by forming the barrier film 61 on electrodes made of a material containing gold.

(Method for Manufacturing Semiconductor Apparatus)

Next, a method for manufacturing a semiconductor apparatus according to the first embodiment of the present invention is described with reference to FIGS. 2A-4.

Figure 2A:
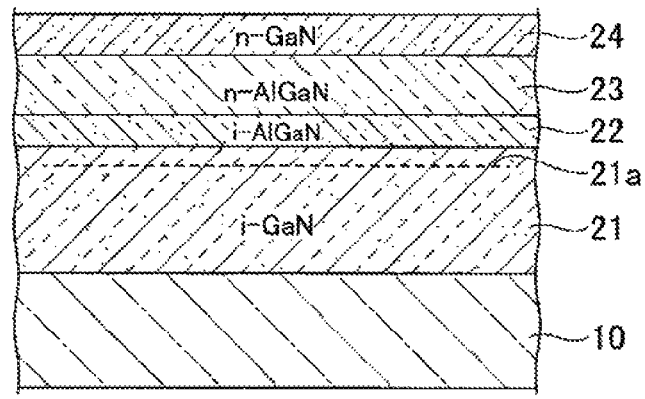
FIGS. 2A-4 are schematic diagrams for describing a method for manufacturing the semiconductor apparatus according to the first embodiment of the present invention.

As illustrated in FIG. 2A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. It is to be noted that the electron transit layer 21, the spacer layer 22, the electron supply layer 23, and the cap layer 24 are formed by epitaxial growth using a MOVPE (Metal Organic Vapor Phase Epitaxy) method. For example, the electron transit layer 21 is formed of a i-GaN layer having a thickness of approximately 3 μm. The spacer layer 22 is formed of a i-GaN having a thickness of approximately 5 nm. The electron supply layer 23 is formed of a n-AlGaN layer having a thickness of approximately 30 nm. The electron transit layer 21, the spacer layer 22, and the electron supply layer 23 are doped with an impurity (e.g., Si) so that the impurity concentration is approximately $5 \times 10^{18}$ cm$^{-3}$. The cap layer 24 is formed of a n-GaN layer having a thickness of approximately 10 nm. The cap layer 24 is doped with an impurity (e.g., Si) so that the impurity concentration is approximately $5 \times 10^{18}$ cm$^{-3}$. Then, a device isolation area (not illustrated) is formed. First, in forming the device isolation area, photoresist is applied on the semiconductor layer configuration. Then, the photoresist is exposed and developed. Thereby, a resist pattern having an opening(s) corresponding to a region where the device isolation area is to be formed. Then, dry-etching is performed on the resist pattern using a gas containing a chlorine component. Then, by forming an insulation film at the dry-etched area or by performing ion injection of a predetermined element at the dry-etched area, the device isolation area is formed.

Figure 2B:
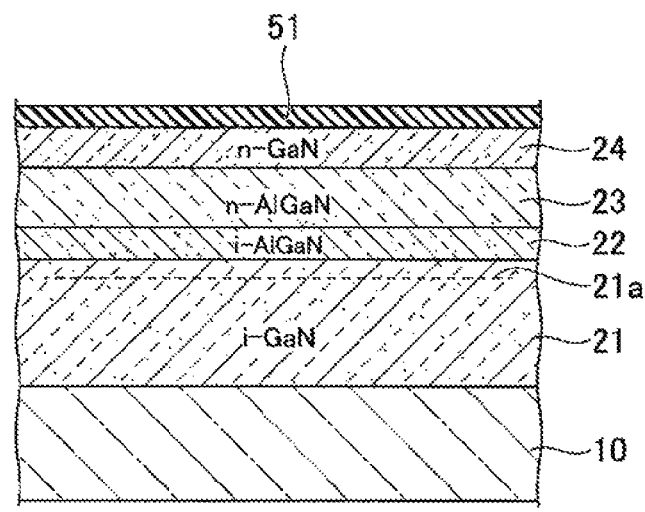

Then, as illustrated in FIG. 2B, the insulation film 51 is formed. The insulation film 51 is formed for the purpose of, for example, passivation. The insulation film 51 is to become a part of the protection film 50. In this embodiment, a SiN film having a film thickness ranging from, for example, 2 nm to 200 nm is used as the insulation film 51. For example, the SiN film may be formed having a thickness of approximately 20 nm by using a sputtering method or a plasma CVD (Chemical Vapor Deposition) method. Although the SiN film is used as the insulation film 51 in this embodiment, other films may be used. For example, an aluminum oxide film ($Al_2O_3$) may alternatively be used as the insulation film 51.

Figure 2C:
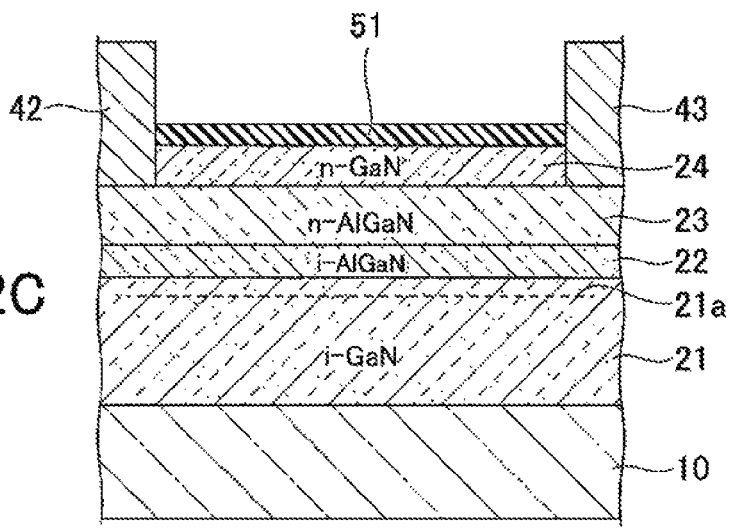

Then, as illustrated in FIG. 2C, the source electrode 42 and the drain electrode 43 are formed on the electron supply layer 23. For example, in forming the source electrode 42 and the drain electrode 43, first, photoresist is applied on the insulation film 51. Then, the photoresist is exposed and developed. Thereby, a resist pattern (not illustrated) having openings corresponding to regions where the source electrode 42 and the drain electrode 43 are to be formed. Then, dry-etching such as RIE (Reactive Ion Etching) is performed on the resist pattern for removing parts of the insulation film 51 and parts of the cap layer 24 corresponding to regions where the resist pattern is not formed. Thereby, the surface of the electron supply layer 23 is exposed. In removing the insulation film 51, a fluorine type gas is used in the dry-etching. In removing the cap layer 24, a chlorine type gas is used in the dry-etching. Then, a metal film having a layered configuration including Ta/Al (Ta: 20 nm, Al: 200 nm) is deposited on the resist pattern by using, for example a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C. Although the resist pattern formed in the above-described embodiment is used for both dry-etching and lift-off, a resist pattern for dry-etching and a resist pattern for lift-off may be formed separately.

Figure 3A:
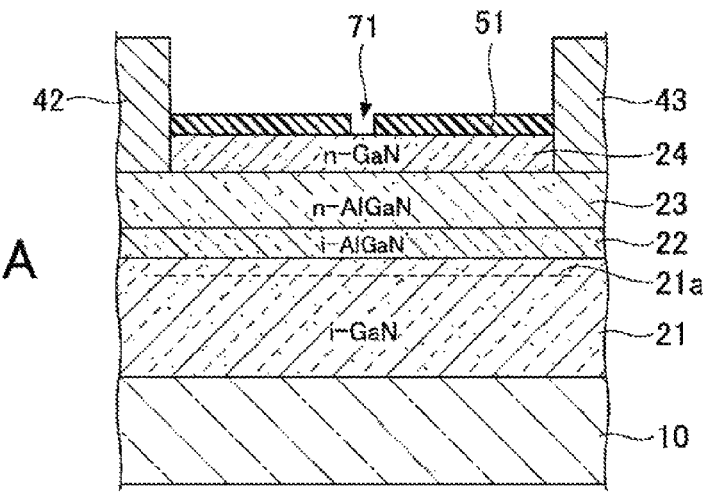

Then, as illustrated in FIG. 3A, an opening 71 is formed in the insulation film 51. The opening 71 is for enabling the gate electrode 41 to contact the semiconductor layer configuration. For example, in forming the opening 71, photoresist is applied to the insulation film 51. Then, the photoresist is exposed and developed. Thereby, a resist pattern (not illustrated) including an opening area is formed in a region in which the opening 71 is to be formed. Then, by performing dry-etching (e.g., RIE) using a fluorine type gas, a part of the insulation film 51 corresponding to the opening area of the resist pattern is removed. Thereby, the opening 71 is formed in the insulation film 51. Then, the resist pattern may be removed by using, for example, an organic solvent.

Figure 3B:
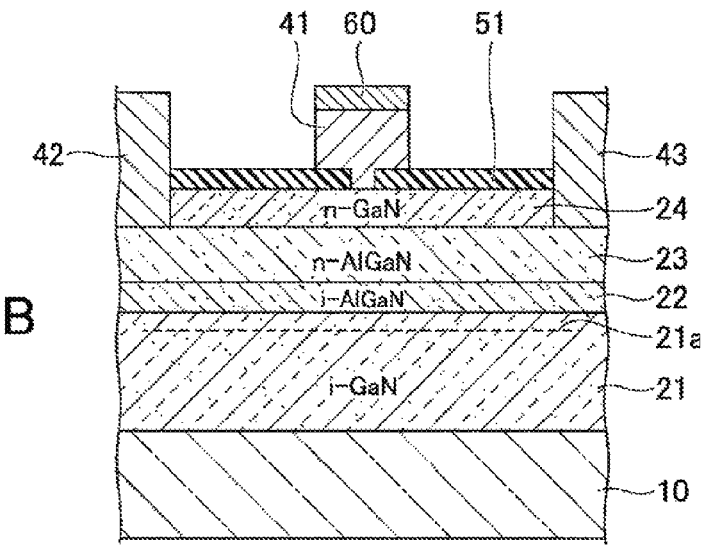

Then, as illustrated in FIG. 3B, the gate electrode 41 and the gate electrode protection film 60 are formed. For example, in forming the gate electrode 41 and the gate electrode protection film 60, first, photoresist is applied to the insulation film 51. Then, the photoresist is exposed and developed. Thereby, a resist pattern (not illustrated) including an opening area is formed in a region in which the gate electrode 41 is to be formed. It is to be noted that the resist pattern is formed so that the opening 71 of the insulation film 51 is positioned within the opening area of the resist pattern. Then, a metal film having a layered configuration including Ni/Au/Ti (Ni: 10 nm, Au: 400 nm, Ti: 20 nm) is deposited on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed in an area where the resist pattern is not formed. Further, the gate of the electrode protection film 60 made of Ti is formed on the gate electrode 41.

Figure 3C:
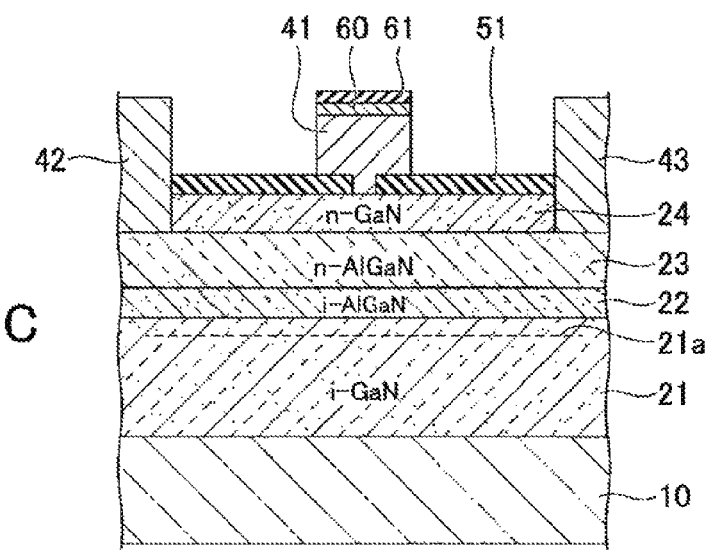

Then, as illustrated in FIG. 3C, the barrier film 61 is formed by oxidizing the surface of the gate electrode protection film 60. For example, the surface of Ti (i.e. surface of gate electrode protection film 60) is oxidized by performing an annealing process in an oxygen atmosphere of approximately 300° C., an asking process using oxygen plasma, or a UV (ultraviolet) ozone process on the surface of Ti. Thereby, the barrier film 61 made of $TiO_2$ is formed. Alternatively, the barrier film 61 may be formed, for example, by natural oxidation of Ti.

Figure 4:
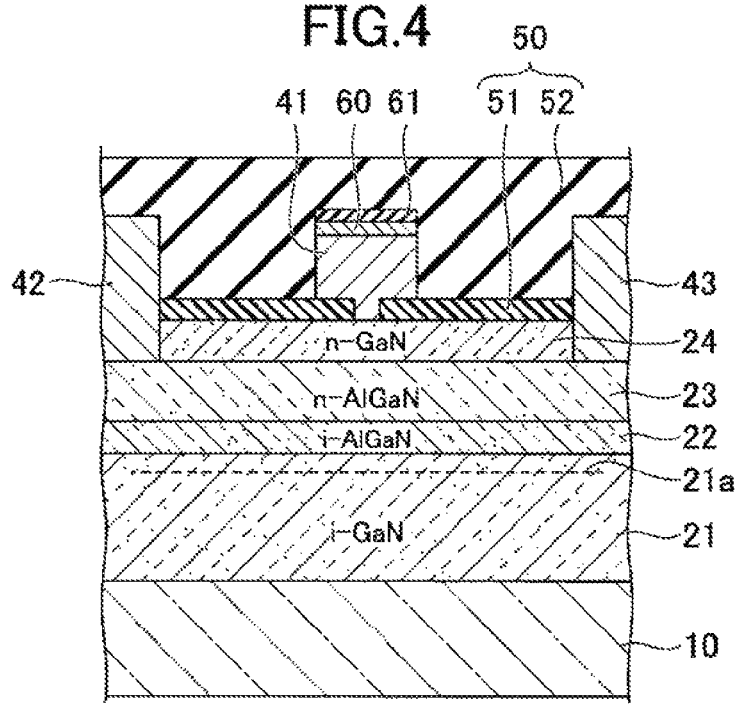

Then, as illustrated in FIG. 4, the insulation film 52 is formed on the insulation film 51, the gate electrode 41 (via the barrier film 61), the source electrode 42, and the drain electrode 43. For example, the insulation film 52 is formed by depositing (e.g., plasma CVD, sputtering) a SiN film having a film thickness of 500 nm. Accordingly, the protection film 50 including the insulation films 51, 52 is formed.

With the semiconductor apparatus 1 according to the above-described embodiment, eutectic between the gold contained in the gate electrode 41 and the insulation film 52 can be prevented because the gate electrode protection film 60 and the barrier film 61 are formed between the gate electrode 41 and the insulation film 52. Thereby, reliability of the semiconductor apparatus 1 can be improved. Further, the protection film 50 may be used as an interlayer insulation film so that another transistor can be formed on the protection film 50. In this case, the reliability of the other transistor is not adversely affected because the electrode protection film 60 and the barrier film 61 are formed on the gate electrode 41. Although the above-described semiconductor apparatus 1 includes both the gate electrode protection film 60 and the barrier film 61, the entire the gate electrode protection film may be removed by oxidization so that only the barrier film 61 remains on the semiconductor apparatus 1.

Although a side surface of the gate electrode 41 contacts the insulation film 52, only a small amount of gold-silicon eutectic is formed because the area in which the gate electrode 41 and the insulation film 52 contact is small. Therefore, the contact between the side surface of the gate electrode 41 and the insulation film has little effect on the semiconductor apparatus. Further, in a case where the gate electrode protection film 50 and the barrier film 61 are formed not only on the top surface of the gate electrode 41 but also on the side surface of the gate electrode 41, reliability of the semiconductor apparatus can be further improved because the entire gate electrode 41 is covered.

Accordingly, the semiconductor apparatus 1 (e.g., transistor) according to the above-described embodiment of the present invention can be manufactured. Although the semiconductor layers of the semiconductor layer configuration according to the above-described embodiment are formed of GaN and AlGaN, the semiconductor layers may alternatively be formed of a nitride such as InAlN or InGaAlN.

Second Embodiment

Semiconductor Apparatus

Figure 5:
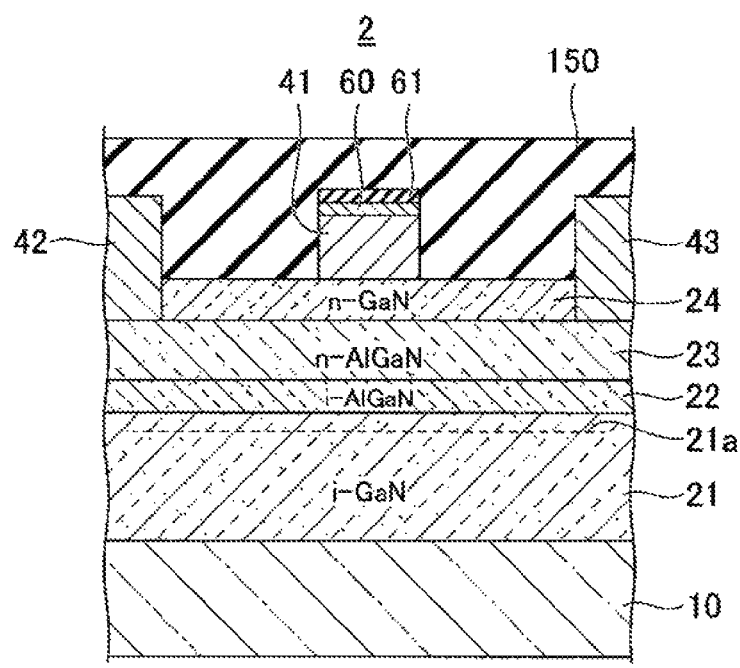
FIG. 5 is a schematic diagram illustrating a configuration of a semiconductor apparatus according to the second embodiment of the present invention.

Next, a semiconductor apparatus 2 according to the second embodiment of the present invention is described with reference to FIG. 5. In the second embodiment, like components are denoted by like reference numerals as of those of the first embodiment and are not further explained.

The semiconductor apparatus 2 according to the second embodiment is also a HEMT. In the semiconductor apparatus 2, the buffer layer (not illustrated) is formed on a surface of the substrate 10 made of, for example, a semiconductor material. A semiconductor layer having a layered configuration including the electron transit layer 21, the spacer layer 22, the electron supply layer 23, and the cap layer 24 is formed on the buffer layer by epitaxial growth. Further, the gate electrode 41 is formed on a region of the cap layer 24 in a manner contacting the cap layer 24. The source electrode 42 and the drain electrode 43 are formed in contact with the electron supply layer 23. The secondary electron gas (2DEG) 21a is formed in a part of the electron transit layer 21 on a side toward the electron supply layer 23. Alternatively, the source electrode 42 and the drain electrode 43 may be formed in contact with the electron transit layer 21. The gate electrode protection film 60 made of a metal material and the barrier film 61 made of an oxide or the like of the metal of the gate electrode protection film 60 are formed on a top part of the gate electrode 41. The insulation film 52 is formed on, for example, an exposed part of the cap layer 24 and the barrier film 61. The protection layer 150 according to the second embodiment is made of SiN. Although the protection film 150 may be formed of, for example, silicon oxide or nitride oxide, it is preferable to form the protection film 150 with SiN considering the aspects such as the adhesive strength and the electric property of SiN.

By forming the gate electrode protection film 60 and the barrier film 61, the gold included in the gate electrode 41 and the silicon included in the protection film 150 can be prevented from contacting each other. Thereby, the formation of gold-silicon eutectic can be prevented. As a result, a highly reliable semiconductor apparatus 2 can be manufactured.

(Method for Manufacturing Semiconductor Apparatus)

Next, a method for manufacturing the semiconductor apparatus 2 according to the second embodiment of the present invention is described with reference to FIGS. 6A-7B.

Figure 6A:
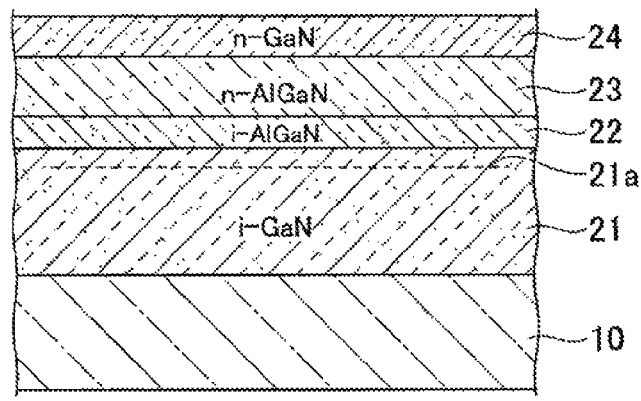
FIGS. 6A-7B are schematic diagrams for describing a method for manufacturing the semiconductor apparatus according to the second embodiment of the present invention.

As illustrated in FIG. 6A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. It is to be noted that the electron transit layer 21, the spacer layer 22, the electron supply layer 23, and the cap layer 24 are formed by epitaxial growth using a MOVPE method. For example, the electron transit layer 21 is formed of a i-GaN layer having a thickness of approximately 3 μm. The spacer layer 22 is formed of a i-GaN having a thickness of approximately 5 nm. The electron supply layer 23 is formed of a n-AlGaN layer having a thickness of approximately 30 nm. The electron transit layer 21, the spacer layer 22, and the electron supply layer 23 are doped with an impurity (e.g., Si) so that the impurity concentration is approximately $5 \times 10^{18}$ $cm^{-3}$. The cap layer 24 is formed of a n-GaN layer having a thickness of approximately 10 nm. The cap layer 24 is doped with an impurity (e.g., Si) so that the impurity concentration is approximately $5 \times 10^{18}$ $cm^{-3}$. Then, a device isolation area (not illustrated) is formed. First, in forming the device isolation area, photoresist is applied on the semiconductor layer configuration. Then, the photoresist is exposed and developed. Thereby, a resist pattern having an opening(s) corresponding to a region where the device isolation area is to be formed. Then, dry-etching is performed on the resist pattern using a gas containing a chlorine component. Then, by forming an insulation film at the dry-etched area or by performing ion injection of a predetermined element at the dry-etched area, the device isolation area is formed.

Figure 6B:
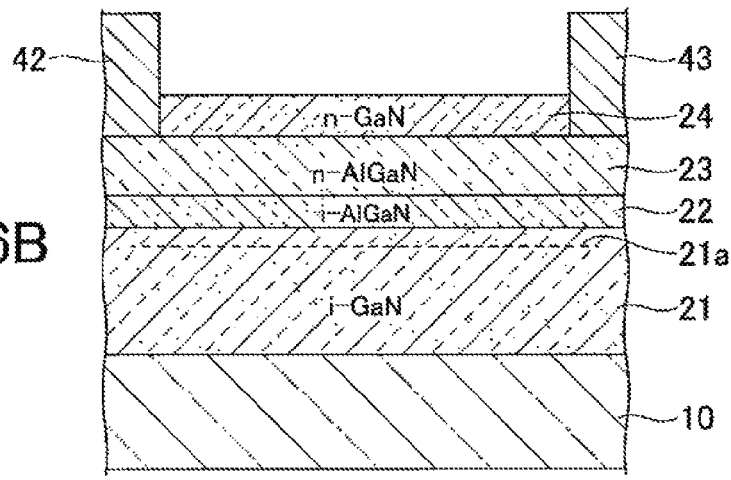

Then, as illustrated in FIG. 6B, the source electrode 42 and the drain electrode 43 are formed on the electron supply layer 23. For example, in forming the source electrode 42 and the drain electrode 43, first, photoresist is applied on the cap layer 24. Then, the photoresist is exposed and developed. Thereby, a resist pattern (not illustrated) having openings corresponding to regions where the source electrode 42 and the drain electrode 43 are to be formed. Then, dry-etching such as RIE (Reactive Ion Etching) is performed on the resist pattern for removing parts of the cap layer 24 corresponding to regions where the resist pattern is not formed. Thereby, the surface of the electron supply layer 23 is exposed. In removing of the cap layer 24, a chlorine type gas is used in the dry-etching. In removing the cap layer 24, a chlorine type gas is used in the dry-etching. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 6C:
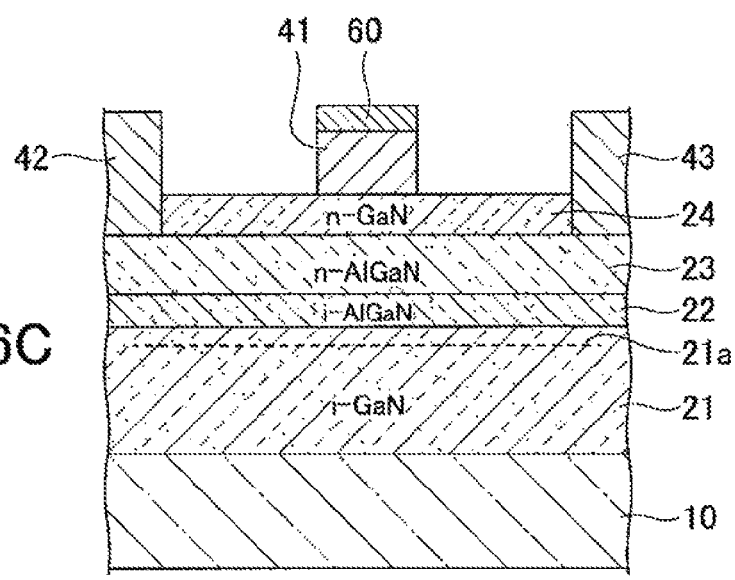

Then, as illustrated in FIG. 6C, the gate electrode 41 and the gate electrode protection film 60 are formed on the cap layer 24. For example, in forming the gate electrode 41 and the gate electrode protection film 60, first, photoresist is applied to the cap layer 24. Then, the photoresist is exposed and developed. Thereby, a resist pattern (not illustrated) including an opening area is formed in a region in which the gate electrode 41 is to be formed. Then, a metal film having a layered configuration including Ni/Au/Ti (Ni: 10 nm, Au: 400 nm, Ti: 20 nm) is deposited on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed in an area where the resist pattern is not formed. Further, the gate of the electrode protection film 60 made of Ti is formed on the gate electrode 41.

Figure 7A:
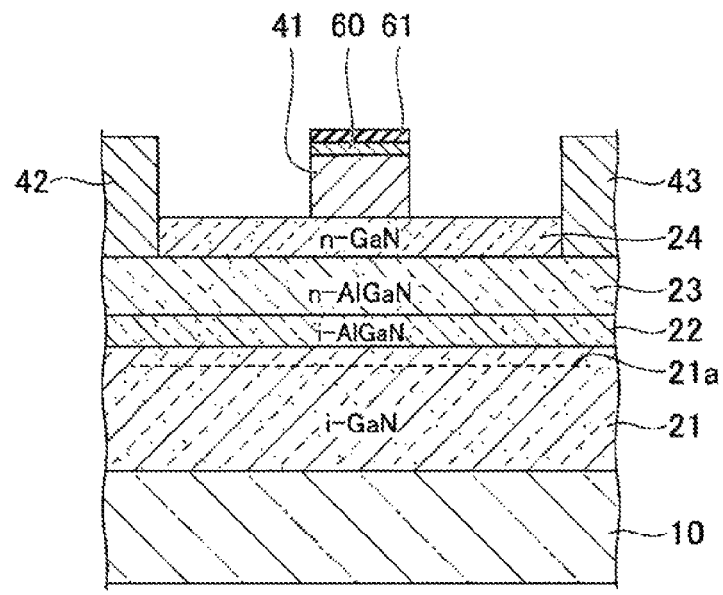

Then, as illustrated in FIG. 7A, the barrier film 61 is formed by oxidizing the surface of the gate electrode protection film 60. For example, the surface of Ti (i.e. surface of gate electrode protection film 60) is oxidized by performing an annealing process in an oxygen atmosphere of approximately 300° C., an asking process using oxygen plasma, or a UV (ultraviolet) ozone process on the surface of Ti. Thereby, the barrier film 61 made of $TiO_2$ is formed. Alternatively, the barrier film 61 may be formed, for example, by natural oxidation of Ti.

Figure 7B:
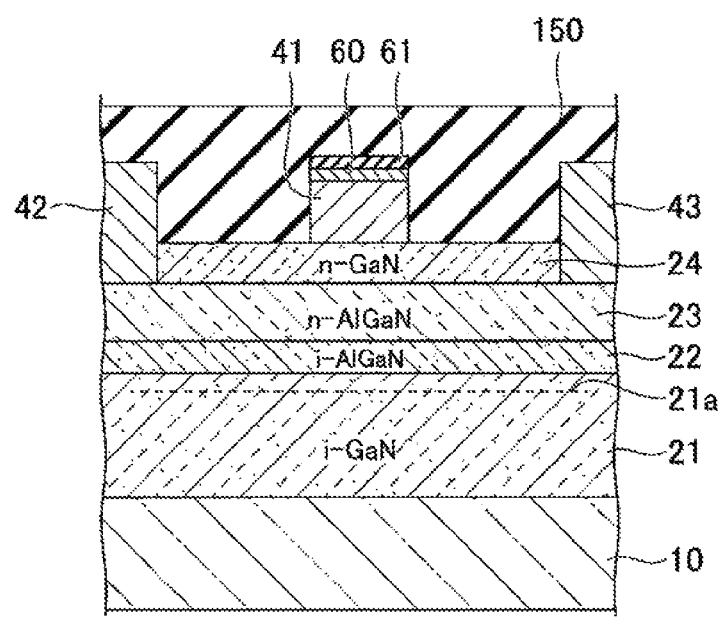

Then, as illustrated in FIG. 7B, the protection film 150 including an insulating material (film) is formed on the cap layer 24, the gate electrode 41 (via the barrier film 61), the source electrode 42, and the drain electrode 43. For example, the protection film 150 is formed by depositing (e.g., plasma CVD, sputtering) a SiN film having a film thickness of 500 nm.

With the semiconductor apparatus 2 according to the above-described embodiment, eutectic between the gold contained in the gate electrode 41 and the silicon contained in the protection film 150 can be prevented because the gate electrode protection film 60 and the barrier film 61 are formed between the gate electrode 41 and the protection film 150. Thereby, reliability of the semiconductor apparatus 2 can be improved. Further, the protection film 150 may be used as an interlayer insulation film so that another transistor can be formed on the protection film 150.

Accordingly, the semiconductor apparatus 2 (e.g., transistor) according to the above-described embodiment of the present invention can be manufactured. Although the semiconductor layers of the semiconductor layer configuration according to the above-described embodiment are formed of GaN and AlGaN, the semiconductor layers may alternatively be formed of a nitride such as InAlN or InGaAlN.

Third Embodiment

Semiconductor Apparatus

Figure 8:
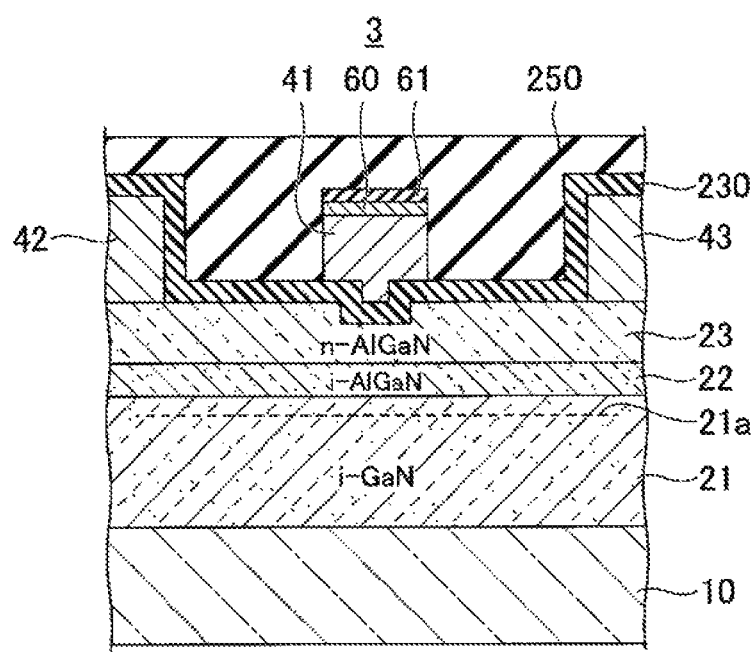
FIG. 8 is a schematic diagram illustrating a configuration of a semiconductor apparatus according to the third embodiment of the present invention.

Next, a semiconductor apparatus 3 according to the second embodiment of the present invention is described with reference to FIG. 8. In the third embodiment, like components are denoted by like reference numerals as of those of the first and second embodiments and are not further explained. The semiconductor apparatus 3 according to the third embodiment is also a HEMT. In the semiconductor apparatus 3, the buffer layer (not illustrated) is formed on a surface of the substrate 10 made of, for example, a semiconductor material. A semiconductor layer having a layered configuration including the electron transit layer 21, the spacer layer 22, the electron supply layer 23, and the cap layer 24 is formed on the buffer layer by epitaxial growth. Thereby, the secondary electron gas (2DEG) 21a is formed in a part of the electron transit layer 21 on a side toward the electron supply layer 23. An opening (which is to become a recess) is formed in the electron supply layer 23. An insulation film 230 (which is to become a gate insulation film) made of oxide aluminum or the like is formed on the electron supply layer 23 including the bottom and the side surfaces of the opening (recess). The gate electrode 41 is formed on a region of the electron supply layer 23 where the recess is formed via an insulation film 230. The source electrode 42 and the drain electrode 43 are formed in contact with the electron supply layer 23. Alternatively, the source electrode 42 and the drain electrode 43 may be formed in contact with the electron transit layer 21. The gate electrode protection film 60 made of a metal material and the barrier film 61 made of an oxide or the like of the metal of the gate electrode protection film 60 are formed on a top part of the gate electrode 41. A protection film 250 including an insulating material (film) is formed on, for example, an exposed part of the insulation film 51 and the barrier film 61. The protection layer 250 according to the third embodiment is made of SiN. Although the protection film 250 may be formed of, for example, silicon oxide or nitride oxide, it is preferable to form the protection film 250 with SiN considering the aspects such as the adhesive strength and the electric property of SiN.

By forming the gate electrode protection film 60 and the barrier film 61, the gold included in the gate electrode 41 and the silicon included in the protection film 250 can be prevented from contacting each other. Thereby, the formation of gold-silicon eutectic can be prevented. As a result, a highly reliable semiconductor apparatus 3 can be manufactured.

(Method for Manufacturing Semiconductor Apparatus)

Next, a method for manufacturing the semiconductor apparatus 3 according to the third embodiment of the present invention is described with reference to FIGS. 9A-11.

Figure 9A:
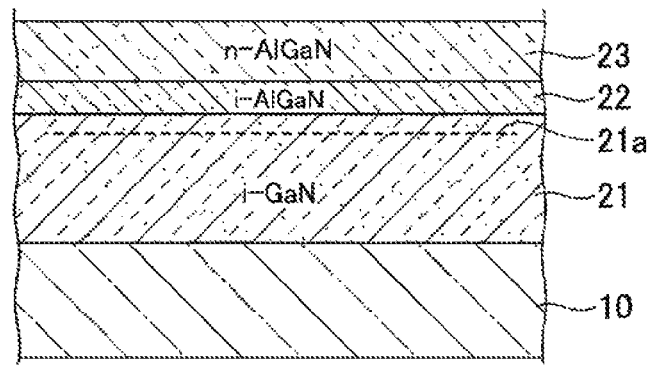
FIGS. 9A-11 are schematic diagrams for describing a method for manufacturing the semiconductor apparatus according to the third embodiment of the present invention.

As illustrated in FIG. 9A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. It is to be noted that the electron transit layer 21, the spacer layer 22, and the electron supply layer 23 are formed by epitaxial growth using a MOVPE method. For example, the electron transit layer 21 is formed of a i-GaN layer having a thickness of approximately 3 μm. The spacer layer 22 is formed of a i-GaN having a thickness of approximately 5 nm. The electron supply layer 23 is formed of a n-AlGaN layer having a thickness of approximately 30 nm. The electron transit layer 21, the spacer layer 22, and the electron supply layer 23 are doped with an impurity (e.g., Si) so that the impurity concentration is approximately $5 \times 10^{18}$ cm$^{-3}$. Then, a device isolation area (not illustrated) is formed.

Figure 9B:
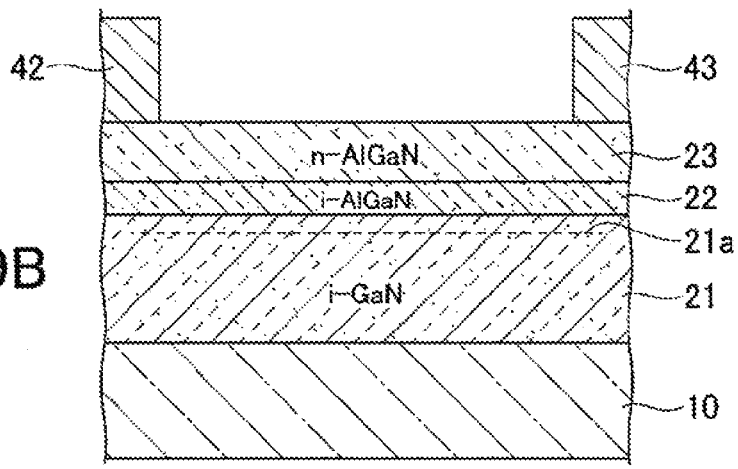

Then, as illustrated in FIG. 9B, the source electrode 42 and the drain electrode 43 are formed on the electron supply layer 23. For example, in forming the source electrode 42 and the drain electrode 43, first, photoresist is applied on the electron supply layer 23. Then, the photoresist is exposed and developed. Thereby, a resist pattern (not illustrated) having openings corresponding to regions where the source electrode 42 and the drain electrode 43 are to be formed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 9C:
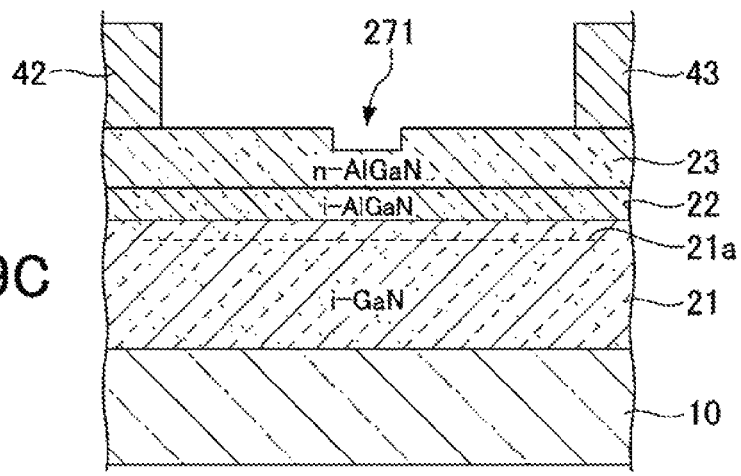

Then, as illustrated in FIG. 9C, a recess 271 is formed in the electron supply layer 23. For example, in forming the recess 271, photoresist is applied to the electron supply layer 23. Then, the photoresist is exposed and developed. Thereby, a resist pattern (not illustrated) including an opening area is formed in a region in which the recess 271 is to be formed. Then, a part of or all of the electron supply layer 23 located at the opening area of the resist pattern (not illustrated) is removed by dry-etching (e.g., RIE) using a chlorine type gas. Thereby, the recess 271 is formed in the electron supply layer 23. Then, the resist pattern may be removed by using, for example, an organic solvent.

Figure 10A:
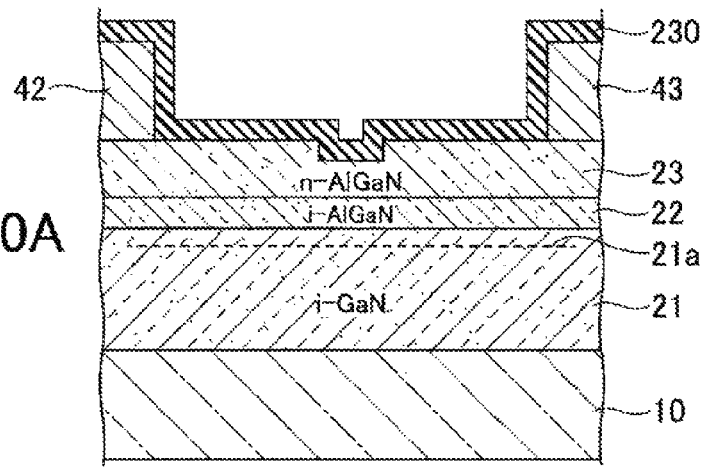

Then, as illustrated in FIG. 10A, an insulation film (which is to become the gate insulation film) 230 is formed on the surface of the electron supply layer 23 including an inner surface of the recess 27. For example, the insulation film 230 is formed by depositing (e.g., ALD (Atomic Layer Deposition), sputtering) an aluminum oxide having a film thickness ranging from 2 nm to 200 nm (e.g., 20 nm).

Figure 10B:
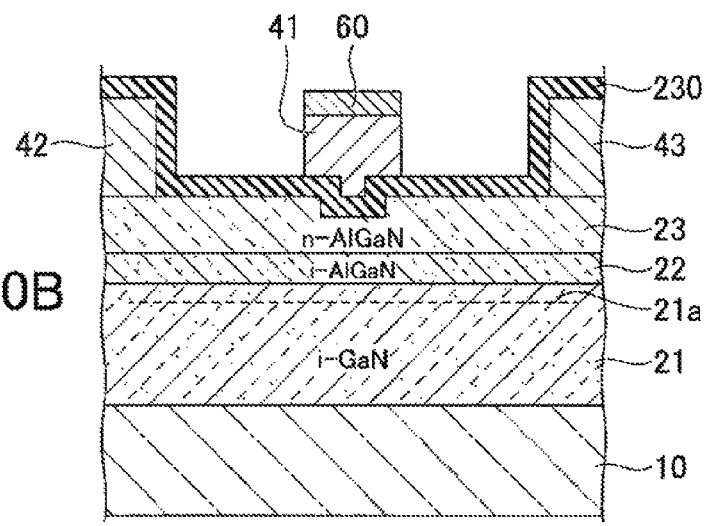

Then, as illustrated in FIG. 10B, the gate electrode 41 and the gate electrode protection film 60 are formed in the region of the insulation film 230 where the recess 271 is formed. For example, in forming the gate electrode 41 and the gate electrode protection film 60, first, photoresist is applied to the insulation film 230. Then, the photoresist is exposed and developed. Thereby, a resist pattern (not illustrated) including an opening area is formed in a region in which the gate electrode 41 is to be formed. It is to be noted that the resist pattern is formed so that the recess 271 is positioned within the opening area of the resist pattern. Then, a metal film having a layered configuration including Ni/Au/Ti (Ni: 10 nm, Au: 400 nm, Ti: 20 nm) is deposited on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed in an area including the region where the recess 271 is formed via the insulation film 230. Further, the gate electrode protection film 60 made of Ti is formed on the gate electrode 41.

Figure 10C:
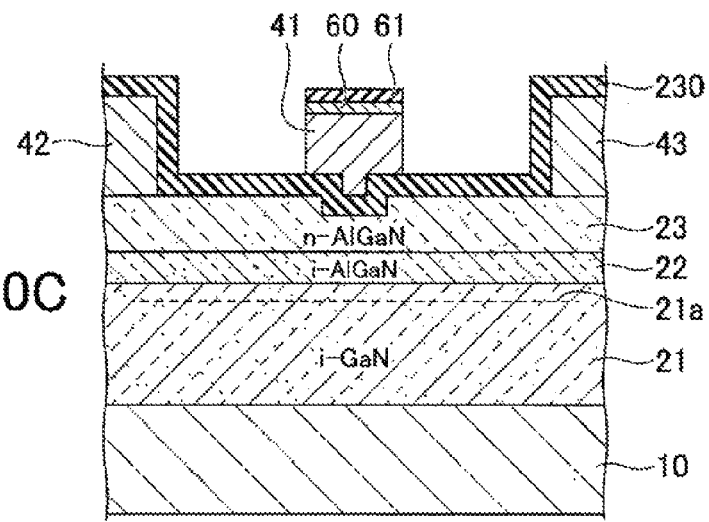

Then, as illustrated in FIG. 10C, the barrier film 61 is formed by oxidizing the surface of the gate electrode protection film 60. For example, the surface of Ti (i.e. surface of gate electrode protection film 60) is oxidized by performing an annealing process in an oxygen atmosphere of approximately 300° C., an asking process using oxygen plasma, or a UV (ultraviolet) ozone process on the surface of Ti. Thereby, the barrier film 61 made of TiO$_2$ is formed. Alternatively, the barrier film 61 may be formed, for example, by natural oxidation of Ti.

Figure 11:
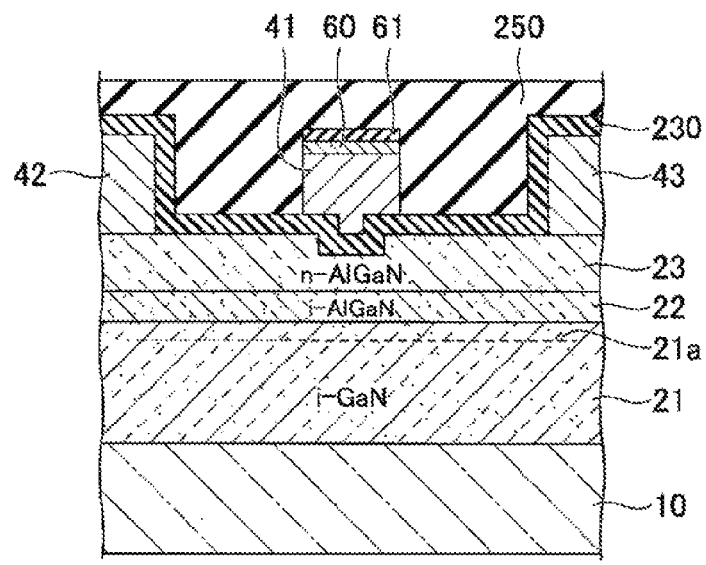

Then, as illustrated in FIG. 11, the protection film 250 is formed on the insulation film 230, the gate electrode 41 (via the barrier film 61), the source electrode 42, and the drain electrode 43. For example, the protection film 250 is formed by depositing (e.g., plasma CVD, sputtering) a SiN film having a film thickness of 500 nm.

With the semiconductor apparatus 3 according to the above-described embodiment, eutectic between the gold contained in the gate electrode 41 and the silicon contained in the protection film 250 can be prevented because the gate electrode protection film 60 and the barrier film 61 are formed between the gate electrode 41 and the protection film 250. Thereby, reliability of the semiconductor apparatus 3 can be improved. Further, the protection film 250 may be used as an interlayer insulation film so that another transistor can be formed on the protection film 250.

Accordingly, the semiconductor apparatus 3 (e.g., transistor) according to the above-described embodiment of the present invention can be manufactured. Although the semiconductor layers of the semiconductor layer configuration according to the above-described embodiment are formed of GaN and AlGaN, the semiconductor layers may alternatively be formed of a nitride such as InAlN or InGaAlN.

Fourth Embodiment

Semiconductor Apparatus

Figure 12:
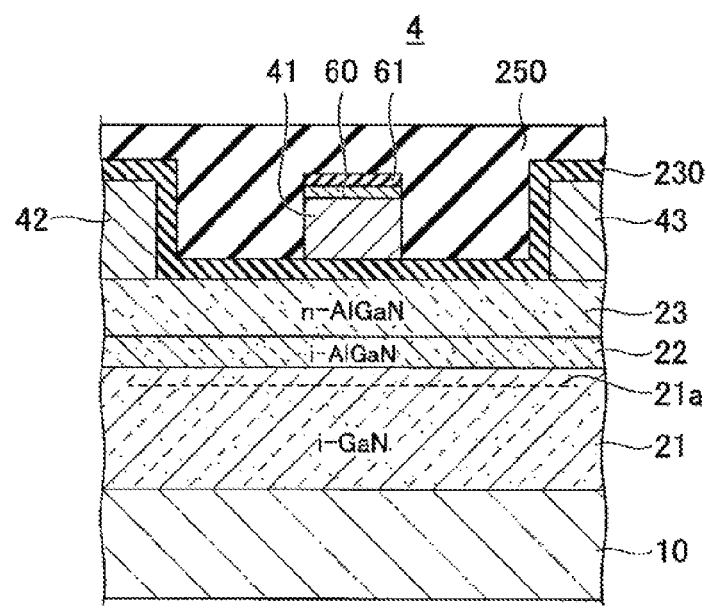
FIG. 12 is a schematic diagram illustrating a configuration of a semiconductor apparatus according to the fourth embodiment of the present invention.

Next, a semiconductor apparatus 4 according to the fourth embodiment of the present invention is described with reference to FIG. 12. In the fourth embodiment, like components are denoted by like reference numerals as of those of the first-third embodiments and are not further explained.

The semiconductor apparatus 4 according to the fourth embodiment is also a HEMT. In the semiconductor apparatus 4, the buffer layer (not illustrated) is formed on a surface of the substrate 10 made of, for example, a semiconductor material. A semiconductor layer having a layered configuration including the electron transit layer 21, the spacer layer 22, and the electron supply layer 23 is formed on the buffer layer by epitaxial growth. Thereby, the secondary electron gas (2DEG) 21a is formed in a part of the electron transit layer 21 on a side toward the electron supply layer 23. The insulation film 230 (which is to become a gate insulation film) made of oxide aluminum or the like is formed on the electron supply layer 23. The gate electrode 41 is formed on a predetermined region of the insulation film 230. The source electrode 42 and the drain electrode 43 are formed in contact with the electron supply layer 23. Alternatively, the source electrode 42 and the drain electrode 43 may be formed in contact with the electron transit layer 21. The gate electrode protection film 60 made of a metal material and the barrier film 61 made of an oxide or the like of the metal of the gate electrode protection film 60 are formed on a top part of the gate electrode 41. A protection film 250 including an insulating material (film) is formed on, for example, an exposed part of the insulation film 51 and the barrier film 61.

By forming the gate electrode protection film 60 and the barrier film 61, the gold contained in the gate electrode 41 and the silicon contained in the protection film 250 can be prevented from contacting each other. Thereby, the formation of gold-silicon eutectic can be prevented. As a result, a highly reliable semiconductor apparatus 4 can be manufactured.

(Method for Manufacturing Semiconductor Apparatus)

Next, a method for manufacturing the semiconductor apparatus 4 according to the fourth embodiment of the present invention is described with reference to FIGS. 13A-14C.

Figure 13A:
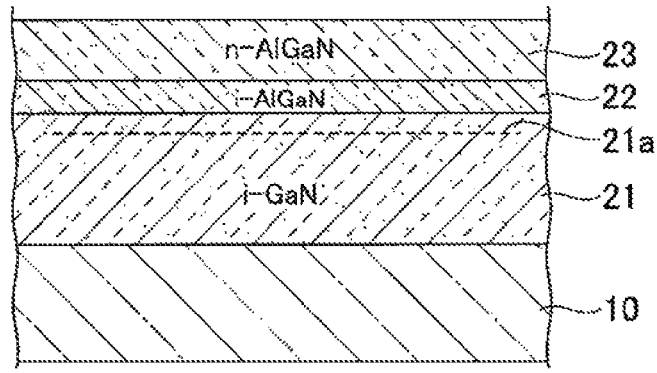
FIGS. 13A-14C are schematic diagrams for describing a method for manufacturing the semiconductor apparatus according to the fourth embodiment of the present invention.

As illustrated in FIG. 13A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, and the electron supply layer (second semiconductor layer) 23 in this order. It is to be noted that the electron transit layer 21, the spacer layer 22, and the electron supply layer 23 are formed by epitaxial growth using a MOVPE method. For example, the electron transit layer 21 is formed of a i-GaN layer having a thickness of approximately 3 μm. The spacer layer 22 is formed of a i-GaN having a thickness of approximately 5 nm. The electron supply layer 23 is formed of a n-AlGaN layer having a thickness of approximately 30 nm. The electron transit layer 21, the spacer layer 22, and the electron supply layer 23 are doped with an impurity (e.g., Si) so that the impurity concentration is approximately $5\times10^{18}$ cm$^{-3}$. Then, a device isolation area (not illustrated) is formed.

Figure 13B:
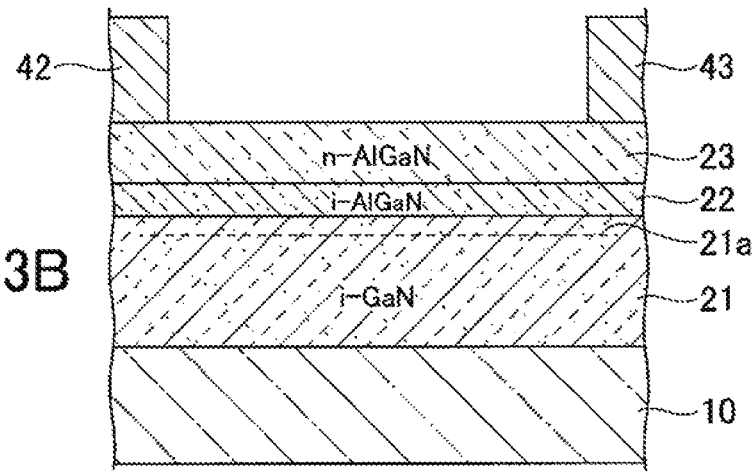

Then, as illustrated in FIG. 13B, the source electrode 42 and the drain electrode 43 are formed on the electron supply layer 23. For example, in forming the source electrode 42 and the drain electrode 43, first, photoresist is applied on the electron supply layer 23. Then, the photoresist is exposed and developed. Thereby, a resist pattern (not illustrated) having openings corresponding to regions where the source electrode 42 and the drain electrode 43 are to be formed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 13C:
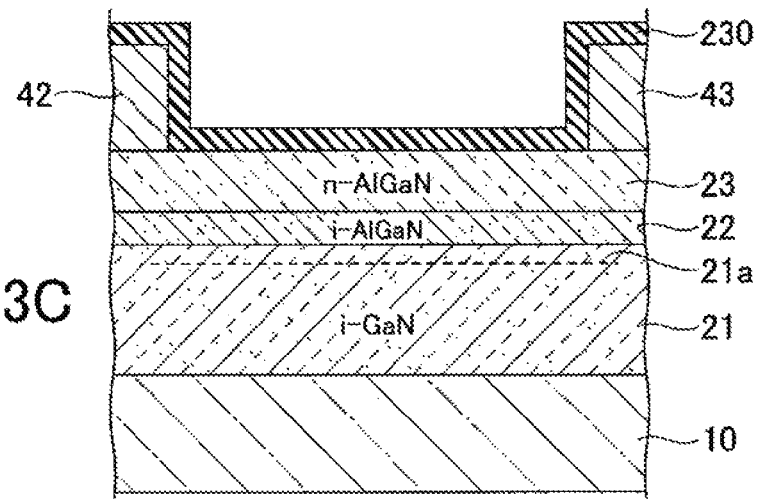

Then, as illustrated in FIG. 13C, an insulation film (which is to become the gate insulation film) 230 is formed on the surface of the electron supply layer 23. For example, the insulation film 230 is formed by depositing (e.g., ALD, sputtering) an aluminum oxide having a film thickness ranging from 2 nm to 200 nm (e.g., 20 nm).

Figure 14A:
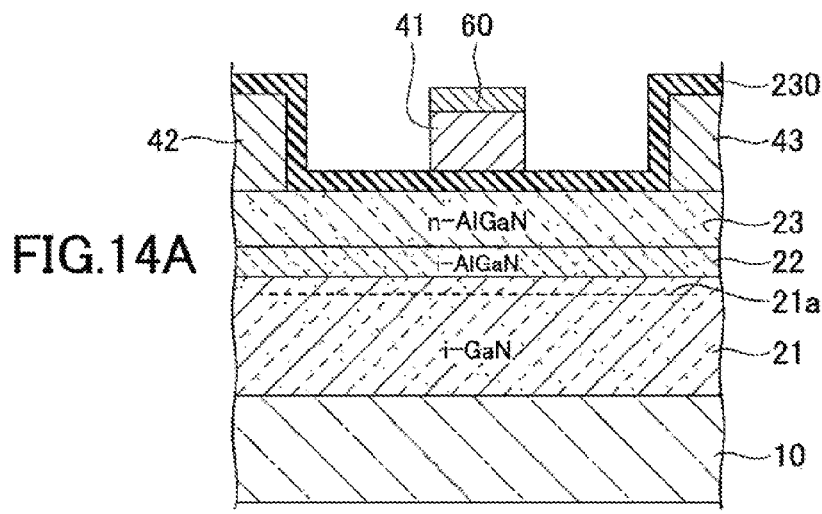

Then, as illustrated in FIG. 14A, the gate electrode 41 and the gate electrode protection film 60 are formed on the insulation film 230. For example, in forming the gate electrode 41 and the gate electrode protection film 60, first, photoresist is applied to the insulation film 230. Then, the photoresist is exposed and developed. Thereby, a resist pattern (not illustrated) including an opening area is formed in a region in which the gate electrode 41 is to be formed. Then, a metal film having a layered configuration including Ni/Au/Ti (Ni: 10 nm, Au: 400 nm, Ti: 20 nm) is deposited on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed on the insulation film 230. Further, the gate electrode protection film 60 made of Ti is formed on the gate electrode 41.

Figure 14B:
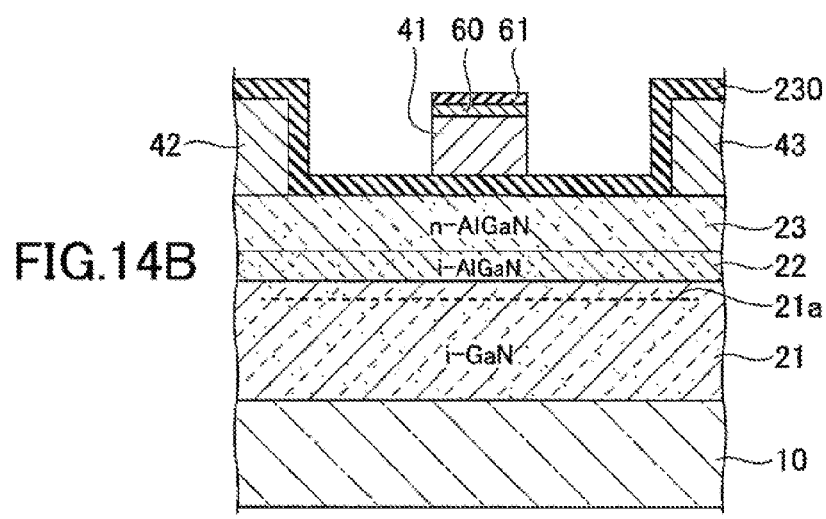

Then, as illustrated in FIG. 14B, the barrier film 61 is formed by oxidizing the surface of the gate electrode protection film 60. For example, the surface of Ti (i.e. surface of gate electrode protection film 60) is oxidized by performing an annealing process in an oxygen atmosphere of approximately 300° C., an asking process using oxygen plasma, or a UV (ultraviolet) ozone process on the surface of Ti. Thereby, the barrier film 61 made of TiO$_2$ is formed. Alternatively, the barrier film 61 may be formed, for example, by natural oxidation of Ti.

Figure 14C:
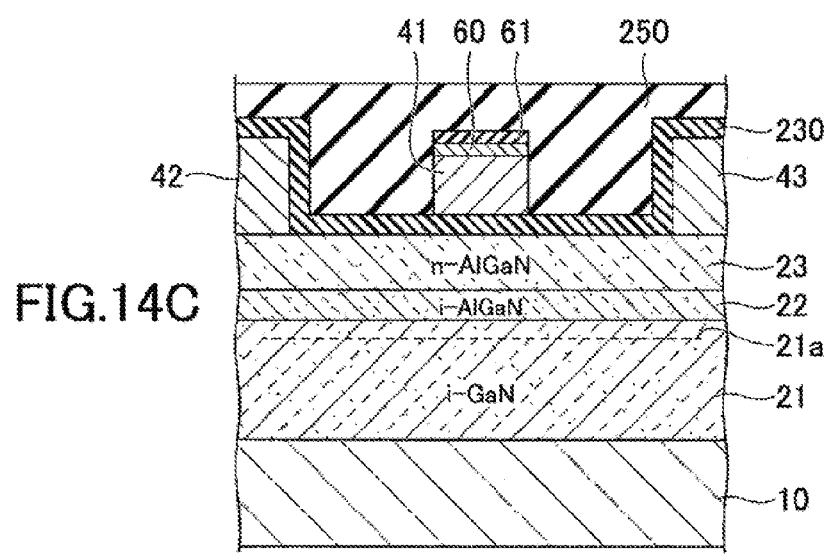

Then, as illustrated in FIG. 14C, the protection film 250 is formed on the insulation film 230, the gate electrode 41 (via the barrier film 61), the source electrode 42, and the drain electrode 43. For example, the protection film 250 is formed by depositing (e.g., plasma CVD, sputtering) a SiN film having a film thickness of 500 nm.

With the semiconductor apparatus 4 according to the above-described embodiment, eutectic between the gold contained in the gate electrode 41 and the silicon contained in the protection film 250 can be prevented because the gate electrode protection film 60 and the barrier film 61 are formed between the gate electrode 41 and the protection film 250. Thereby, reliability of the semiconductor apparatus 4 can be improved. Further, the protection film 250 may be used as an interlayer insulation film so that another transistor can be formed on the protection film 250.

Accordingly, the semiconductor apparatus 4 (e.g., transistor) according to the above-described embodiment of the present invention can be manufactured. Although the semiconductor layers of the semiconductor layer configuration according to the above-described embodiment are formed of GaN and AlGaN, the semiconductor layers may alternatively be formed of a nitride such as InAlN or InGaAlN.

Fifth Embodiment

Semiconductor Apparatus

Figure 15:
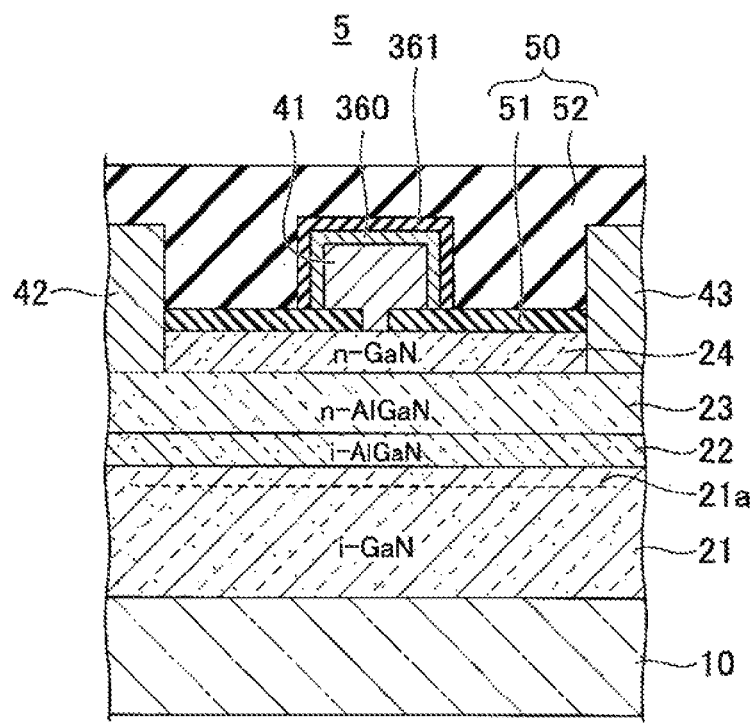
FIG. 15 is a schematic diagram illustrating a configuration of a semiconductor apparatus according to the fifth embodiment of the present invention.

Next, a semiconductor apparatus 5 according to the fifth embodiment of the present invention is described with reference to FIG. 15. In the fifth embodiment, like components are denoted by like reference numerals as of those of the first-fourth embodiments and are not further explained.

The semiconductor apparatus 5 according to the fifth embodiment is also a HEMT. In the semiconductor apparatus 5, the buffer layer (not illustrated) is formed on a surface of the substrate 10 made of, for example, a semiconductor material. A semiconductor layer having a layered configuration including the electron transit layer 21, the spacer layer 22, the electron supply layer 23, and the cap layer 24 is formed on the buffer layer by epitaxial growth. Thereby, the secondary electron gas (2DEG) 21a is formed in a part of the electron transit layer 21 on a side toward the electron supply layer 23. Further, the insulation film 51 including an opening is formed on the cap layer 24. The gate electrode 41 is formed in the opening of the insulation film 51 and contacts the cap layer 24. In this embodiment, the source electrode 42 and the drain electrode 43 are formed in contact with the electron supply layer 23. However, alternatively, the source electrode 42 and the drain electrode 43 may be formed in contact with the electron transit layer 21.

A gate electrode protection film 360 made of a metal material and a barrier film 361 made of an oxide or the like of the metal of the gate electrode protection film 360 are formed on a top part and a side surface of the gate electrode 41. The insulation film 52 is formed on, for example, an exposed part of the insulation film 51 and the barrier film 361. The protection layer 50 is formed on, for example, the insulation films 51, 52.

By forming the gate electrode protection film 360 and the barrier film 361, the gold included in the gate electrode 41 and the silicon included in the insulation film 52 can be prevented from contacting each other. Thereby, the formation of gold-silicon eutectic can be prevented. As a result, a highly reliable semiconductor apparatus 5 can be manufactured. It is to be noted that the same material can be used for the gate electrode protection film 360 as that of the gate electrode protection film 60 of the first embodiment. Further, the same material can be used for the barrier film 361 as that of the barrier film 61 of the first embodiment.

(Method for Manufacturing Semiconductor Apparatus)

Next, a method for manufacturing the semiconductor apparatus 5 according to the fifth embodiment of the present invention is described with reference to FIGS. 16A-18B.

Figure 16A:
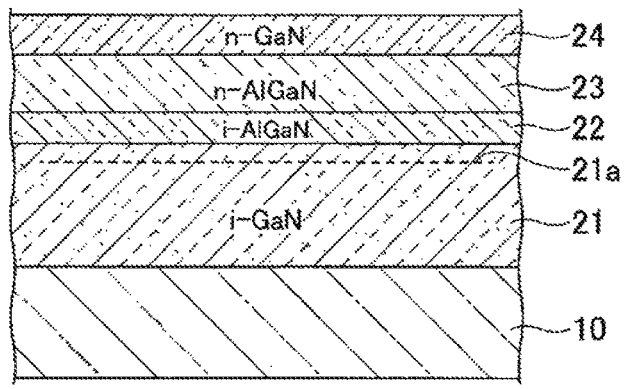
FIGS. 16A-19 are schematic diagrams for describing a method for manufacturing the semiconductor apparatus according to the fifth embodiment of the present invention.

As illustrated in FIG. 16A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. Then, although not illustrated in the drawings, the device isolation area is formed.

Figure 16B:
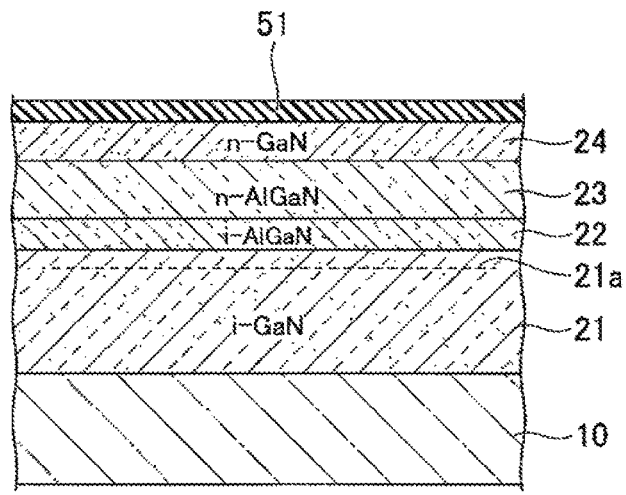

Then, as illustrated in FIG. 16B, the insulation film 51 is formed. In this embodiment, a SiN film having a thickness ranging from 2 nm to 200 nm (e.g., 20 nm) is formed as the insulation film 51.

Figure 16C:
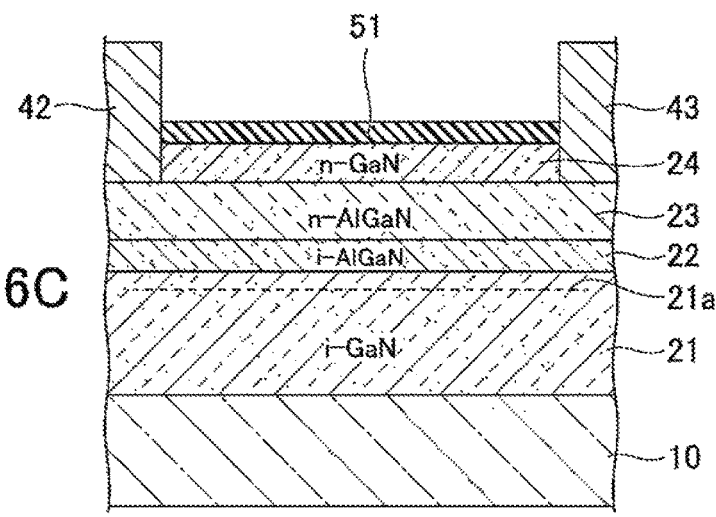

Then, as illustrated in FIG. 16C, the source electrode 42 and the drain electrode 43 are formed on the electron supply layer 23. For example, in forming the source electrode 42 and the drain electrode 43, first, photoresist is applied on the insulation film 51. Then, the photoresist is exposed and developed. Thereby, a resist pattern (not illustrated) having openings corresponding to regions where the source electrode 42 and the drain electrode 43 are to be formed. Then, dry-etching such as RIE (Reactive Ion Etching) is performed on the resist pattern for removing parts of the insulation film 51 and the cap layer 24 corresponding to regions where the resist pattern is not formed. Thereby, the surface of the electron supply layer 23 is exposed. In removing of the cap layer 24, a chlorine type gas is used in the dry-etching. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 17A:
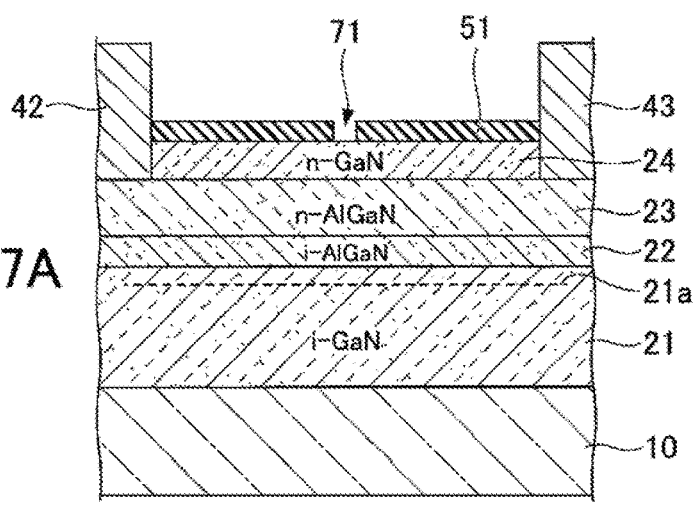

Then, as illustrated in FIG. 17A, the opening 71 is formed in the insulation film 51. For example, in forming the opening 71, photoresist is applied to the insulation film 51. Then, the photoresist is exposed and developed. Thereby, a resist pattern (not illustrated) including an opening area is formed in a region in which the opening 71 is to be formed. Then, by performing dry-etching (e.g., RIE) using a fluorine type gas, a part of the insulation film 51 corresponding to the opening area of the resist pattern is removed. Thereby, the opening 71 is formed in the insulation film 51. Then, the resist pattern may be removed by using, for example, an organic solvent.

Figure 17B:
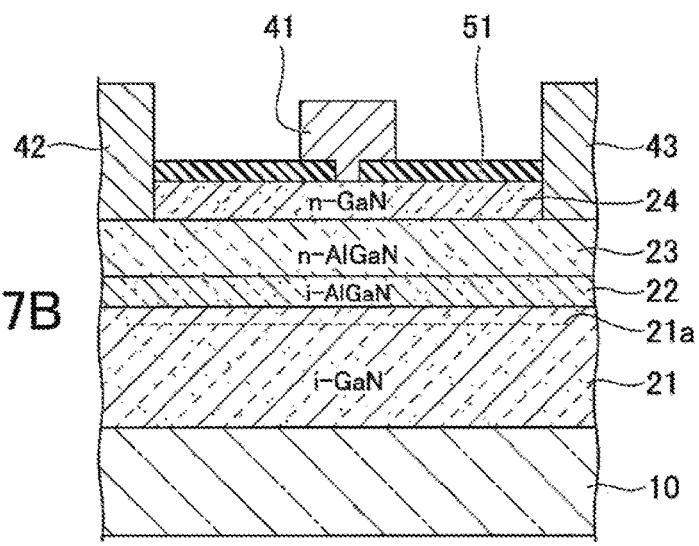

Then, as illustrated in FIG. 17B, the gate electrode 41 is formed. For example, in forming the gate electrode 41, first, photoresist is applied to the insulation film 51. Then, the photoresist is exposed and developed. Thereby, a resist pattern (not illustrated) including an opening area is formed in a region in which the gate electrode 41 is to be formed. It is to be noted that the resist pattern is formed so that the opening 71 of the insulation film 51 is positioned within the opening area of the resist pattern. Then, a metal film having a layered configuration including Ni/Au (Ni: 10 nm, Au: 400 nm) is deposited on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed in an area where the resist pattern is not formed.

Figure 17C:
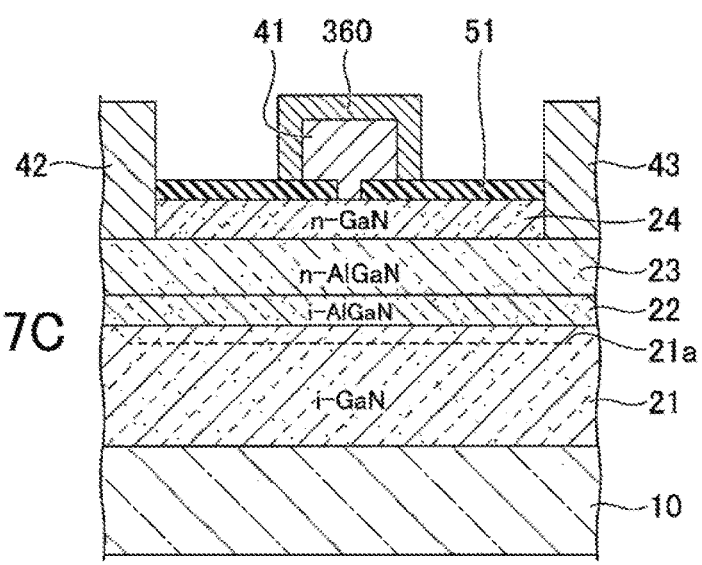

Then, as illustrated in FIG. 17C, the gate electrode protection film 360 is formed. For example, in forming the gate electrode protection film 360, first, photoresist is applied on the insulation film 51. Then, the photoresist is exposed and developed. Thereby, a resist pattern (not illustrated) having an opening corresponding to a region where the gate electrode protection film 360 is to be formed. The resist pattern used in forming the gate electrode protection film 360 has a slightly larger opening compared to that of the resist pattern used in forming the gate electrode 41. Thereby, the gate electrode protection film 360 can be formed on the entire surface of the gate electrode 41 (in this embodiment, upper and side surfaces of the gate electrode 41). Then, a metal film made of Ti (Ti: 20 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C. Thereby, the gate electrode protection film 360 made of Ti is formed on the entire surface (i.e. upper and side surfaces) of the gate electrode 41.

Figure 18A:
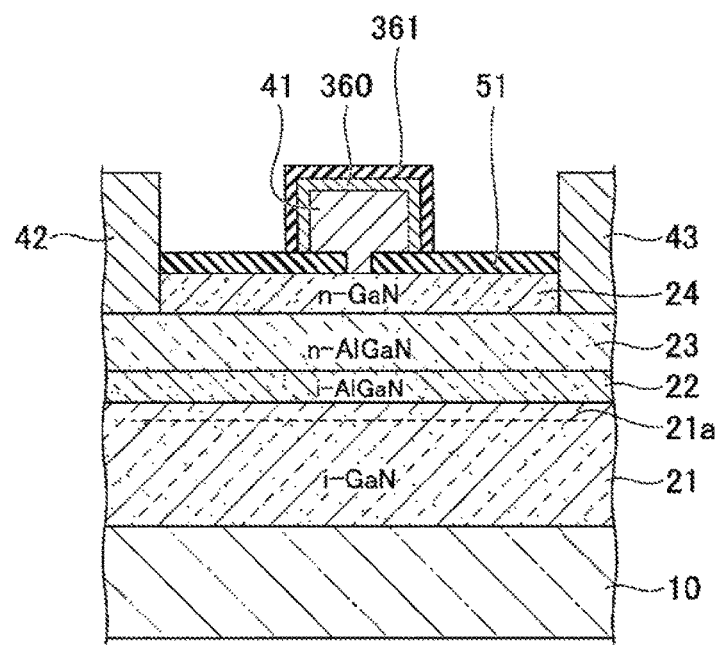

Then, as illustrated in FIG. 18A, the barrier film 361 is formed by oxidizing the surface of the gate electrode protection film 360. For example, the surface of Ti (i.e. surface of gate electrode protection film 60) is oxidized by performing an annealing process in an oxygen atmosphere of approximately 300° C., an asking process using oxygen plasma, or a UV (ultraviolet) ozone process on the surface of Ti. Thereby, the barrier film 361 made of $TiO_2$ is formed.

Figure 18B:
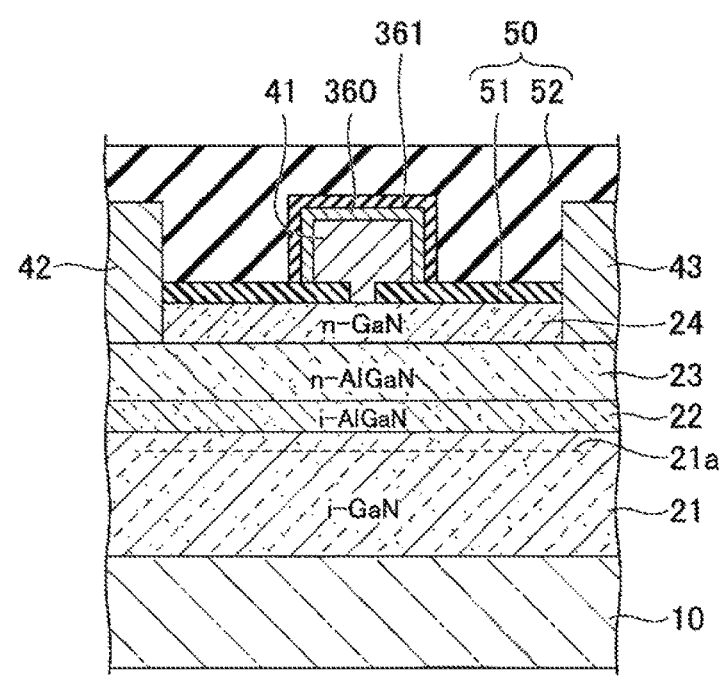

Then, as illustrated in FIG. 18B, the insulation film 52 is formed on the insulation film 51, the gate electrode 41 (via the barrier film 361), the source electrode 42, and the drain electrode 43. For example, the insulation film 52 is formed by depositing (e.g., plasma CVD, sputtering) a SiN film having a film thickness of 500 nm. Accordingly, the protection film 50 including the insulation films 51, 52 is formed.

With the semiconductor apparatus 5 according to the above-described embodiment, eutectic between the gold included in the gate electrode 41 and the silicon included in the insulation film 52 can be prevented because the gate electrode protection film 360 and the barrier film 361 are formed between the gate electrode 41 and the insulation film 52. Thereby, reliability of the semiconductor apparatus 5 can be improved. Further, the protection film 50 may be used as an interlayer insulation film so that another transistor can be formed on the protection film 50.

Figure 19:
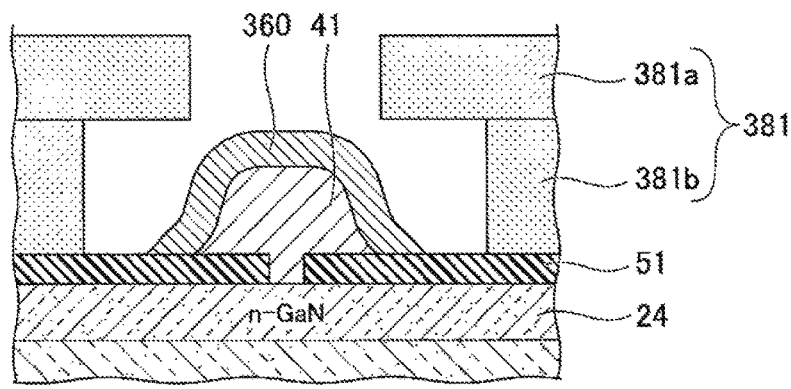

In the above-described embodiment, resist patterns are formed separately for the gate electrode 41 and the gate electrode protection film 360. By forming a double layer resist pattern in which the layer toward a top surface of the double layer resist pattern has a smaller area than the layer toward a bottom surface of the double layer resist pattern or by forming an opening becoming wider towards the bottom surface (reverse taper resist pattern), the above-described configuration of the semiconductor apparatus 5 can be fabricated by performing a resist pattern process once. For example, in a case of using the double layer resist pattern, first, a metal film made of Ni/Au is deposited by vapor deposition, and then, another metal film made of Ti is deposited by vapor deposition. When depositing Ti, a Ti deposition source (i.e. source for depositing Ti) is set in a position more towards the substrate 10 than a Ni/Au deposition source (i.e. source for depositing Ni or Au) or a position offset from a normal line on the surface of the substrate 10. By setting the Ti deposition source towards the substrate 10, oblique incident components of Ti deposition particles with respect to the surface of the substrate 10 can be increased. Thereby, the Ti deposition particles can enter the inside of the opening of the resist pattern. Accordingly, not only can the metal film made of Ti be formed on the top surface of the metal film made of Ni/Au but also on the side surface of the metal film made of Ni/Au. FIG. 19 illustrates an example where the gate electrode 41 and the gate electrode protection film 360 are formed by the above-described method using a double layer resist pattern 381. The double layer resist pattern 381 includes a top part 381a and a bottom part 381b. An opening formed in the top part 381a is smaller than an opening formed in the bottom part 381b.

Accordingly, the semiconductor apparatus 5 (e.g., transistor) according to the above-described embodiment of the present invention can be manufactured. The gate electrode protection film 360 and the barrier film 361 in this embodiment may be applied to the gate electrode protection film and the barrier film of the above-described second-fourth embodiments of the present invention.

Sixth Embodiment

Semiconductor Apparatus

Figure 20:
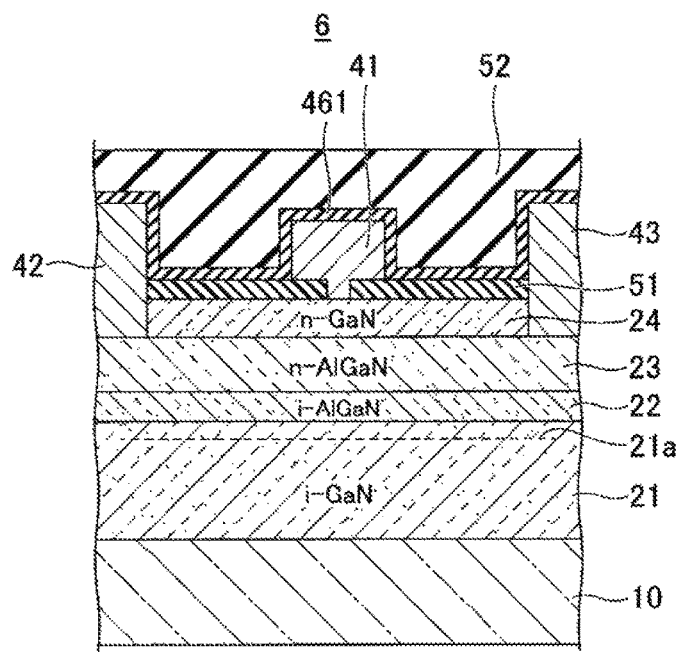
FIG. 20 is a schematic diagram illustrating a configuration of a semiconductor apparatus according to the sixth embodiment of the present invention.

Next, a semiconductor apparatus 6 according to the sixth embodiment of the present invention is described with reference to FIG. 20. In the sixth embodiment, like components are denoted by like reference numerals as of those of the first-fifth embodiments and are not further explained.

The semiconductor apparatus 6 according to the sixth embodiment is also a HEMT. In the semiconductor apparatus 6, the buffer layer (not illustrated) is formed on a surface of the substrate 10 made of, for example, a semiconductor material. A semiconductor layer having a layered configuration including the electron transit layer 21, the spacer layer 22, the electron supply layer 23, and the cap layer 24 is formed on the buffer layer by epitaxial growth. Thereby, the secondary electron gas (2DEG) 21a is formed in a part of the electron transit layer 21 on a side toward the electron supply layer 23. Further, the insulation film 51 including an opening is formed on the cap layer 24. The gate electrode 41 is formed in the opening of the insulation film 51 and contacts the cap layer 24. In this embodiment, the source electrode 42 and the drain electrode 43 are formed in contact with the electron supply layer 23. However, alternatively, the source electrode 42 and the drain electrode 43 may be formed in contact with the electron transit layer 21.

A barrier insulation film 461 is formed on the top and side surfaces of the gate electrode 41 and on the cap layer 24. Further, the insulation film 52 is formed on, for example, the barrier insulation film 461, the source electrode 42, and the drain electrode 43. A protection film may be formed on the insulation film 52. In this embodiment, the barrier insulation film 461 is formed by depositing (e.g., ALD, sputtering) an aluminum oxide having a film thickness ranging from 2 nm to 200 nm (e.g., 20 nm). By forming the barrier insulation film 461 between the gate electrode 52 and the insulation film 52, the gold included in the gate electrode 41 and the silicon included in the insulation film 52 can be prevented from contacting each other. Thereby, eutectic between the gold included in the gate electrode 41 and the silicon included in the insulation film 52 can be prevented. Accordingly, reliability of the semiconductor apparatus 6 can be improved.

(Method for Manufacturing Semiconductor Apparatus)

Next, a method for manufacturing the semiconductor apparatus 6 according to the sixth embodiment of the present invention is described with reference to FIGS. 21A-23.

Figure 21A:
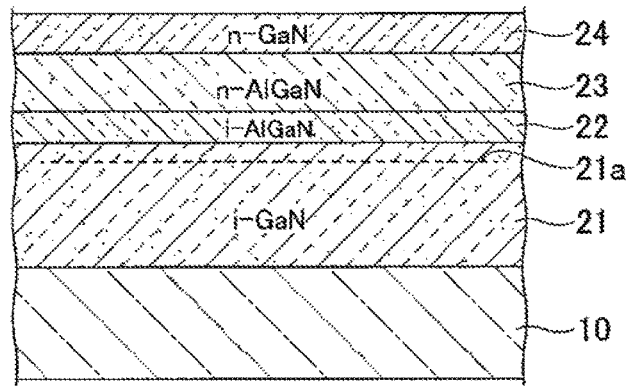
FIGS. 21A-23 are schematic diagrams for describing a method for manufacturing the semiconductor apparatus according to the sixth embodiment of the present invention.

As illustrated in FIG. 21A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. Then, although not illustrated in the drawings, the device isolation area is formed.

Figure 21B:
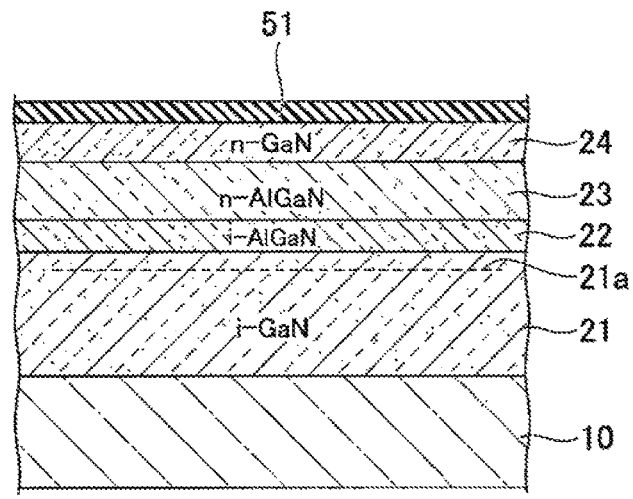

Then, as illustrated in FIG. 21B, the insulation film 51 is formed. In this embodiment, a SiN film having a thickness ranging from 2 nm to 200 nm (e.g., 20 nm) is formed as the insulation film 51.

Figure 21C:
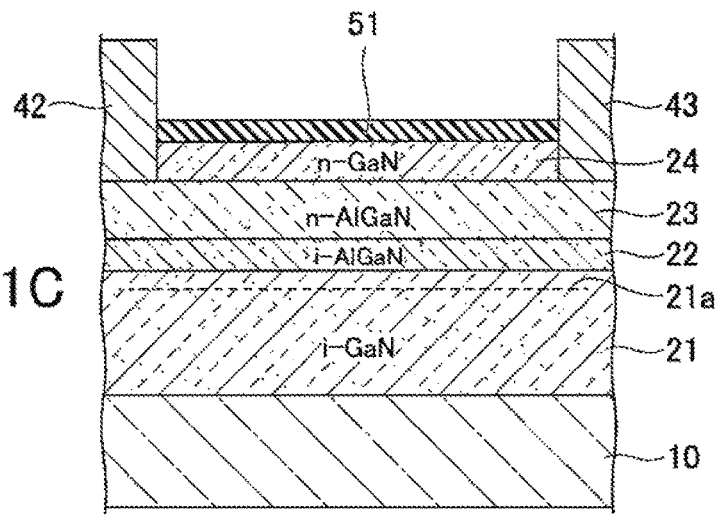

Then, as illustrated in FIG. 21C, the source electrode 42 and the drain electrode 43 are formed on the electron supply layer 23. For example, in forming the source electrode 42 and the drain electrode 43, first, photoresist is applied on the insulation film 51. Then, the photoresist is exposed and developed. Thereby, a resist pattern (not illustrated) having openings corresponding to regions where the source electrode 42 and the drain electrode 43 are to be formed. Then, dry-etching such as RIE (Reactive Ion Etching) is performed on the resist pattern for removing parts of the insulation film 51 and the cap layer 24 corresponding to regions where the resist pattern is not formed. Thereby, the surface of the electron supply layer 23 is exposed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 22A:
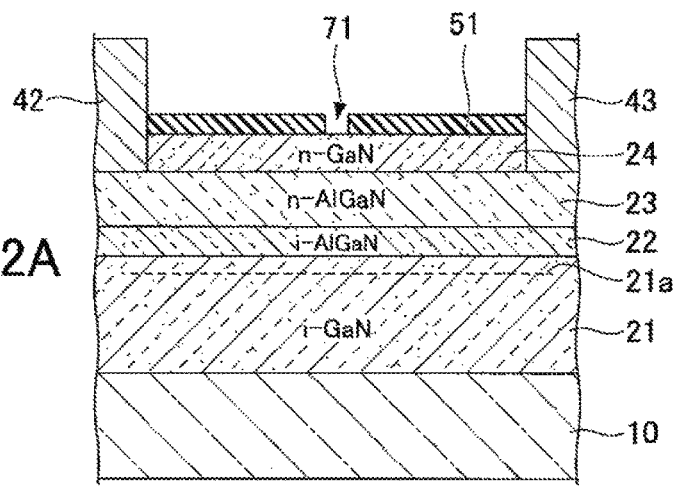

Then, as illustrated in FIG. 22A, the opening 71 is formed in the insulation film 51. For example, in forming the opening 71, photoresist is applied to the insulation film 51. Then, the photoresist is exposed and developed. Thereby, a resist pattern (not illustrated) including an opening area is formed in a region in which the opening 71 is to be formed. Then, by performing dry-etching (e.g., RIE) using a fluorine type gas, a part of the insulation film 51 corresponding to the opening area of the resist pattern is removed. Thereby, the opening 71 is formed in the insulation film 51. Then, the resist pattern may be removed by using, for example, an organic solvent.

Figure 22B:
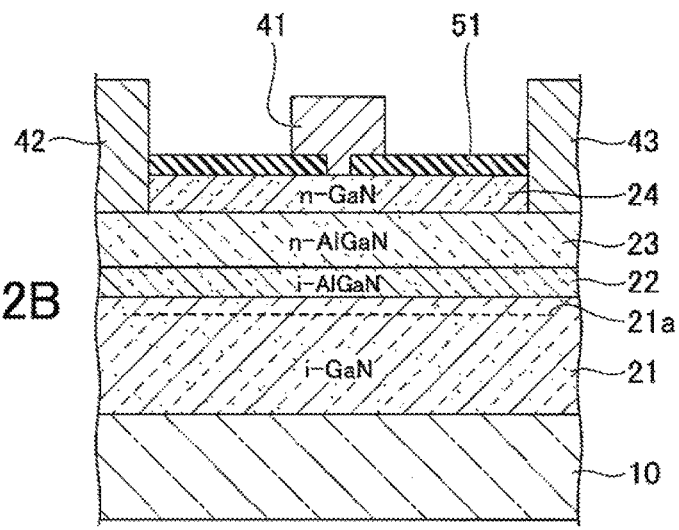

Then, as illustrated in FIG. 22B, the gate electrode 41 is formed. For example, in forming the gate electrode 41, first, photoresist is applied to the insulation film 51. Then, the photoresist is exposed and developed. Thereby, a resist pattern (not illustrated) including an opening area is formed in a region in which the gate electrode 41 is to be formed. It is to be noted that the resist pattern is formed so that the opening 71 of the insulation film 51 is positioned within the opening area of the resist pattern. Then, a metal film having a layered configuration including Ni/Au (Ni: 10 nm, Au: 400 nm) is deposited on entire surface of the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed.

Figure 22C:
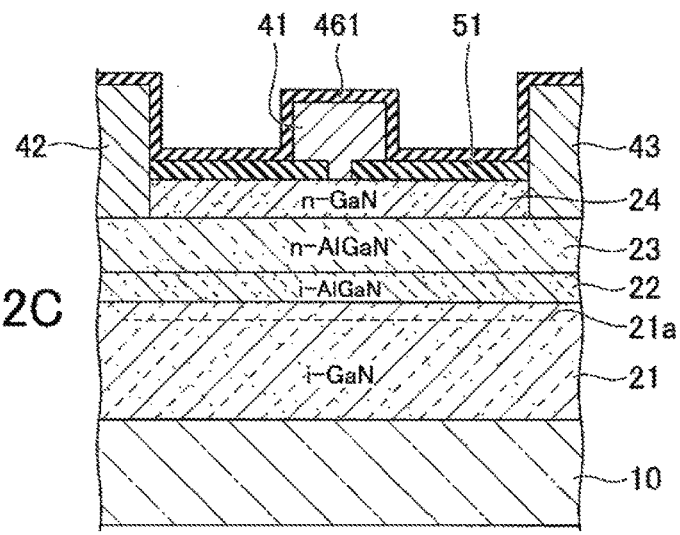

Then, as illustrated in FIG. 22C, the barrier insulation film 461 is formed on the top and side surfaces of the gate electrode 41 and on the cap layer 24. In this embodiment, the barrier insulation film 461 is formed by depositing (e.g., sputtering) an oxide aluminum film having a film thickness of approximately 20 nm.

Figure 23:
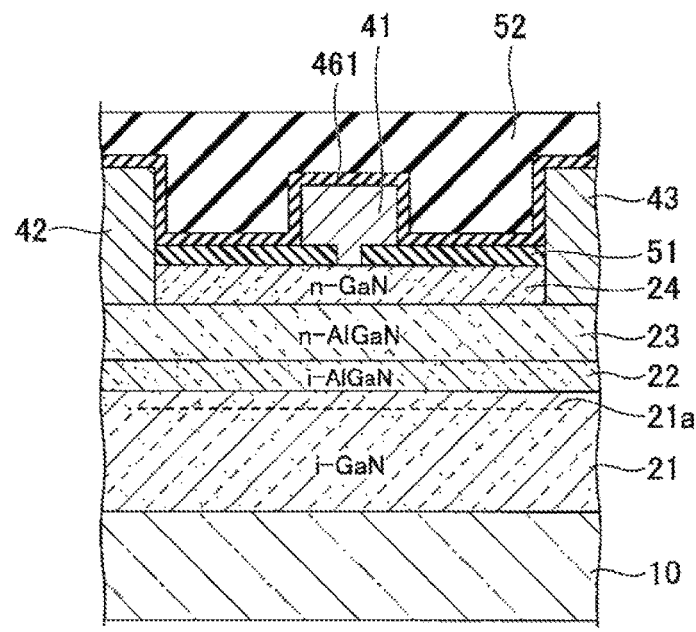

Then, as illustrated in FIG. 23, the insulation film 52 is formed on the barrier insulation film 461. For example, the insulation film 52 is formed by depositing (e.g., plasma CVD, sputtering) a SiN film having a film thickness of 500 nm. Accordingly, a protection film including the insulation film 52 is formed.

With the semiconductor apparatus 6 according to the above-described embodiment, eutectic between the gold included in the gate electrode 41 and the silicon included in the insulation film 52 can be prevented because the barrier insulation film 461 is formed between the gate electrode 41 and the insulation film 52. Thereby, reliability of the semiconductor apparatus 6 can be improved. That is, in this embodiment, there is no area in which the gate electrode 41 and the insulation film 52 directly contact each other because the top and side surfaces of the gate electrode 41 is covered by the barrier insulation film 461. Accordingly, the formation of gold-silicon eutectic can be prevented. As a result, a highly reliable semiconductor apparatus 6 can be manufactured. The barrier insulation film 461 can be applied to the below-described seventh-tenth embodiments of the present invention.

Seventh Embodiment

Semiconductor Apparatus

Figure 24:
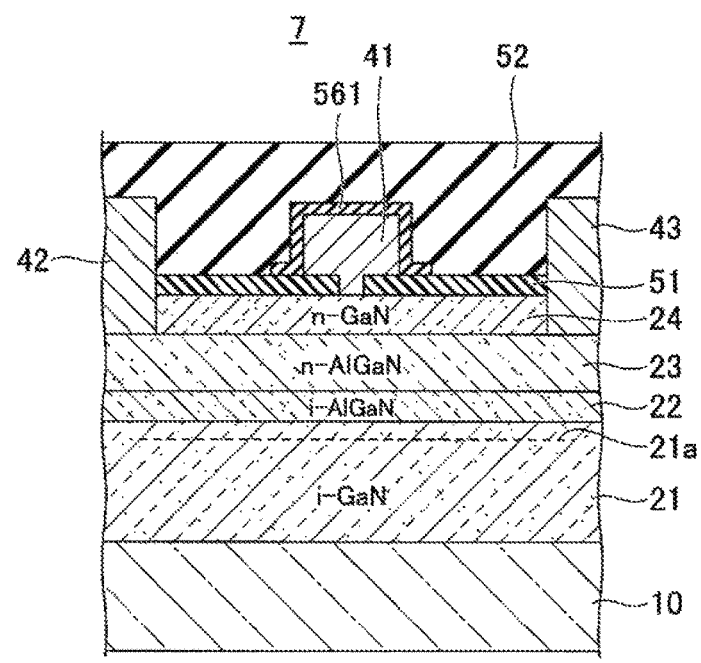
FIG. 24 is a schematic diagram illustrating a configuration of a semiconductor apparatus according to the seventh embodiment of the present invention.

Next, a semiconductor apparatus 7 according to the seventh embodiment of the present invention is described with reference to FIG. 24. In the seventh embodiment, like components are denoted by like reference numerals as of those of the first-sixth embodiments and are not further explained.

The semiconductor apparatus 7 according to the seventh embodiment is also a HEMT. In the semiconductor apparatus 7, the buffer layer (not illustrated) is formed on a surface of the substrate 10 made of, for example, a semiconductor material. A semiconductor layer having a layered configuration including the electron transit layer 21, the spacer layer 22, the electron supply layer 23, and the cap layer 24 is formed on the buffer layer by epitaxial growth. Thereby, the secondary electron gas (2DEG) 21a is formed in a part of the electron transit layer 21 on a side toward the electron supply layer 23. Further, the insulation film 51 including an opening is formed on the cap layer 24. The gate electrode 41 is formed in the opening of the insulation film 51 and contacts the cap layer 24. In this embodiment, the source electrode 42 and the drain electrode 43 are formed in contact with the electron supply layer 23. However, alternatively, the source electrode 42 and the drain electrode 43 may be formed in contact with the electron transit layer 21.

A barrier insulation film 561 is formed on the top and side surfaces of the gate electrode 41. Further, the insulation film 52 is formed on, for example, the barrier insulation film 561 and the insulation film 51. A protection film may be formed on the insulation films 51 and 52. In this embodiment, the barrier insulation film 561 is formed by depositing (e.g., ALD, sputtering) an aluminum oxide having a film thickness ranging from 2 nm to 200 nm (e.g., 20 nm). The barrier insulation film 561 is formed in a manner covering the gate electrode 51. That is, the barrier insulation film 561 is formed only on the top and side surfaces of the gate electrode 41 and not on the insulation film 51. The barrier insulation film 561 is formed in such manner because resistance to pressure may degrade if a film made of aluminum oxide is formed entirely on the insulation film 51. Accordingly, by forming the barrier insulation film 561 between the gate electrode 41 and the insulation film 52, the formation of gold-silicon eutectic can be prevented. As a result, a highly reliable semiconductor apparatus 7 can be manufactured without degrading the properties of the semiconductor apparatus 7.

(Method for Manufacturing Semiconductor Apparatus)

Next, a method for manufacturing the semiconductor apparatus 7 according to the seventh embodiment of the present invention is described with reference to FIGS. 25A-27B.

Figure 25A:
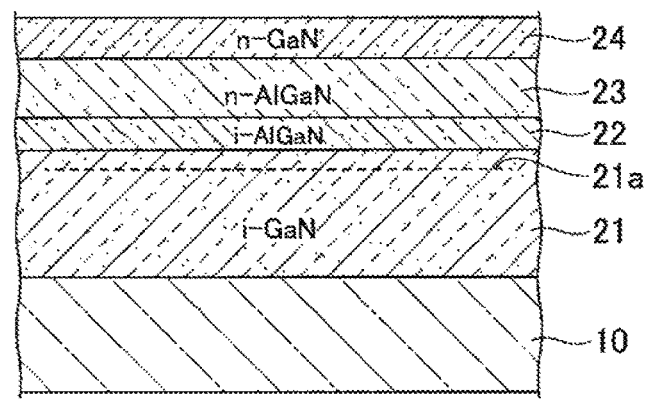
FIG. 25A-27B are schematic diagrams for describing a method for manufacturing the semiconductor apparatus according to the seventh embodiment of the present invention.

As illustrated in FIG. 25A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. Then, although not illustrated in the drawings, the device isolation area is formed.

As illustrated in FIG. 21A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. Then, although not illustrated in the drawings, the device isolation area is formed.

Figure 25B:
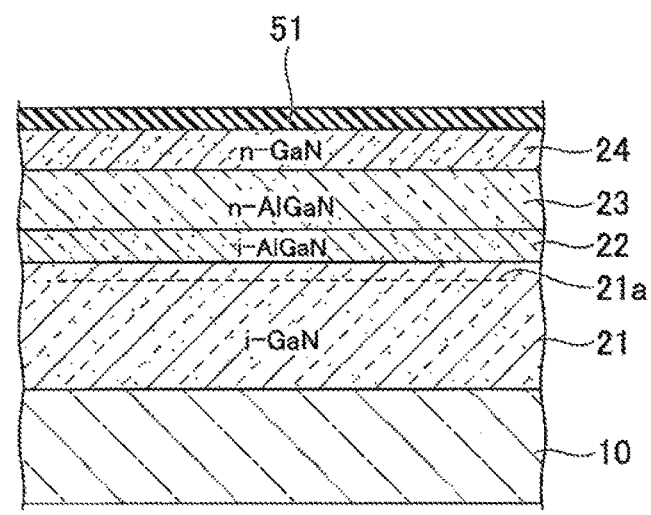

Then, as illustrated in FIG. 25B, the insulation film 51 is formed. In this embodiment, a SiN film having a thickness ranging from 2 nm to 200 nm (e.g., 20 nm) is formed as the insulation film 51.

Figure 25C:
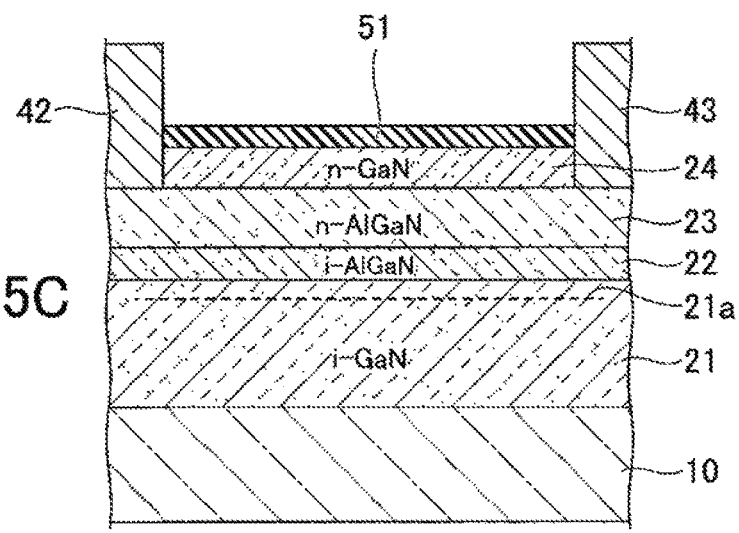

Then, as illustrated in FIG. 25C, the source electrode 42 and the drain electrode 43 are formed on the electron supply layer 23. For example, in forming the source electrode 42 and the drain electrode 43, first, photoresist is applied on the insulation film 51. Then, the photoresist is exposed and developed. Thereby, a resist pattern (not illustrated) having openings corresponding to regions where the source electrode 42 and the drain electrode 43 are to be formed. Then, dry-etching such as RIE (Reactive Ion Etching) is performed on the resist pattern for removing parts of the insulation film 51 and the cap layer 24 corresponding to regions where the resist pattern is not formed. Thereby, the surface of the electron supply layer 23 is exposed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed. After the lift-off, ohmic contact can be achieved by performing a thermal process in a temperature of 550° C.

Figure 26A:
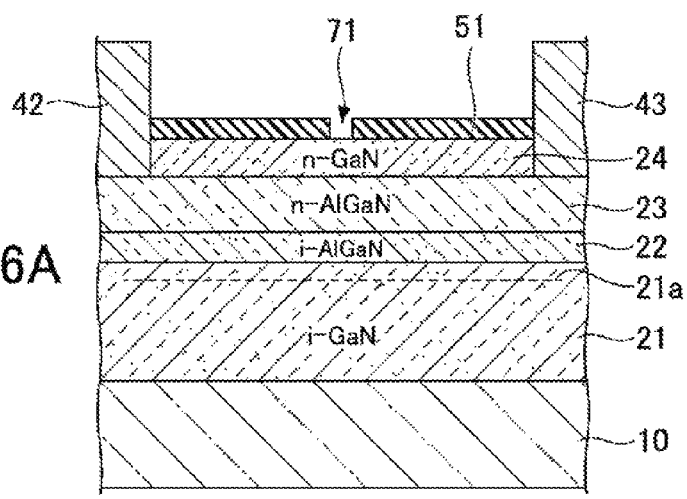

Then, as illustrated in FIG. 26A, the opening 71 is formed in the insulation film 51. For example, in forming the opening 71, photoresist is applied to the insulation film 51. Then, the photoresist is exposed and developed. Thereby, a resist pattern (not illustrated) including an opening area is formed in a region in which the opening 71 is to be formed. Then, by performing dry-etching (e.g., RIE) using a fluorine type gas, a part of the insulation film 51 corresponding to the opening area of the resist pattern is removed. Thereby, the opening 71 is formed in the insulation film 51. Then, the resist pattern may be removed by using, for example, an organic solvent.

Figure 26B:
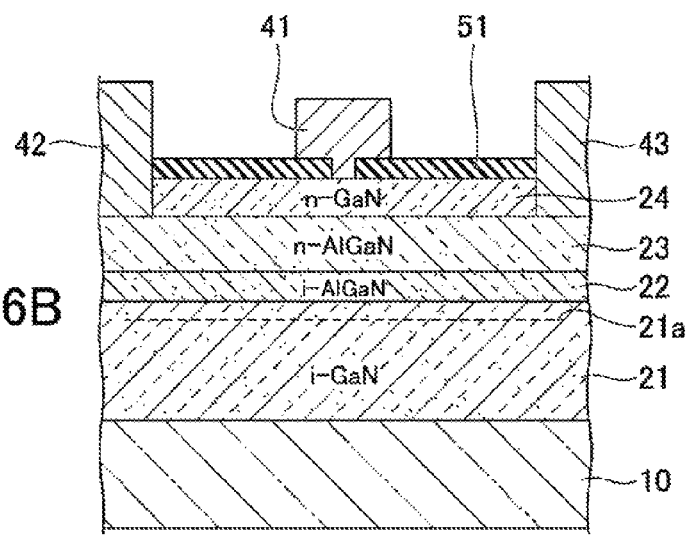

Then, as illustrated in FIG. 26B, the gate electrode 41 is formed. For example, in forming the gate electrode 41, first, photoresist is applied to the insulation film 51. Then, the photoresist is exposed and developed. Thereby, a resist pattern (not illustrated) including an opening area is formed in a region in which the gate electrode 41 is to be formed. It is to be noted that the resist pattern is formed so that the opening 71 of the insulation film 51 is positioned within the opening area of the resist pattern. Then, a metal film having a layered configuration including Ni/Au (Ni: 10 nm, Au: 400 nm) is deposited on entire surface of the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed.

Figure 26C:
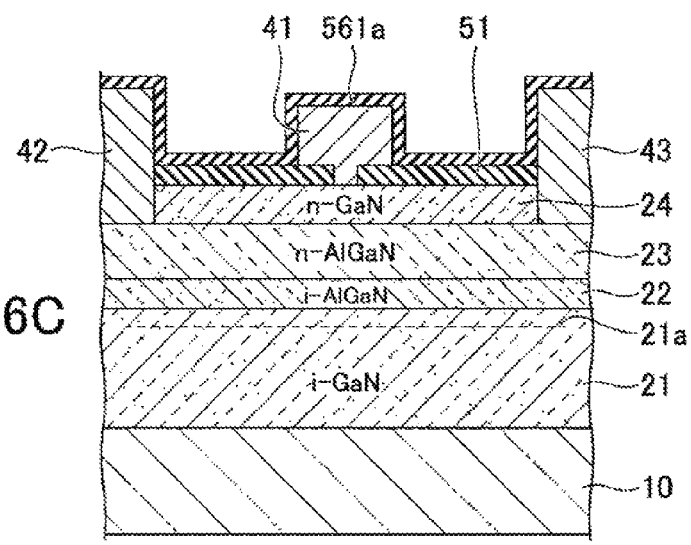

Then, as illustrated in FIG. 26C, the barrier insulation film 461 is formed on the top and side surfaces of the gate electrode 41 and on the cap layer 24. In this embodiment, the barrier insulation film 461 is formed by depositing (e.g., sputtering) an oxide aluminum film having a film thickness of approximately 20 nm.

Figure 27A:
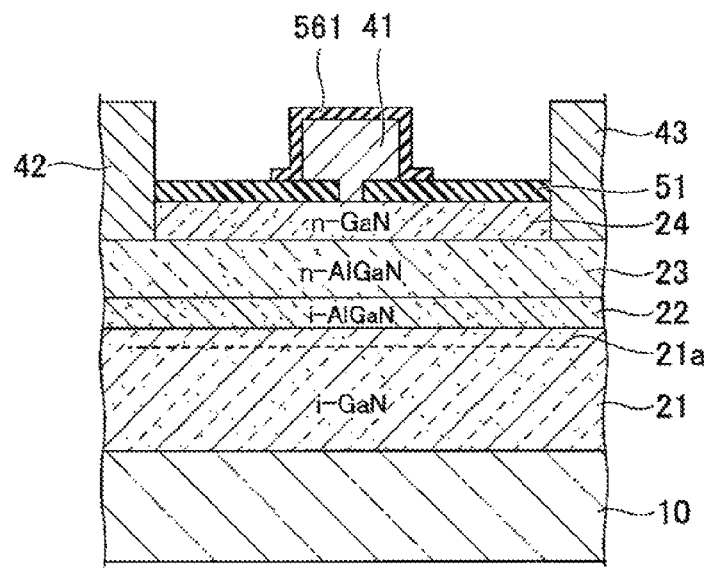

Then, as illustrated in FIG. 27A, the barrier insulation film 561 is formed on the top and side surfaces of the gate electrode 41. For example, in forming the barrier insulation film 561, first, photoresist is applied to the insulation film 561a. Then, the photoresist is exposed and developed. Thereby, a resist pattern (not illustrated) is formed. The resist pattern has the photoresist remaining on the top and side surfaces of the gate electrode 41 and includes an opening area formed on, for example, the surface of the insulation film 51. Then, wet-etching using TMAH (Tetra-Methyl Ammonium Hydroxide) is performed on the resist pattern for removing parts of the insulation film 561a corresponding to regions where the resist pattern is not formed. Then, the resist pattern is removed. As a result, the barrier insulation film 561 is formed by the remaining insulation film 561a. The resist pattern may be removed by using, for example, an organic solvent.

Figure 27B:
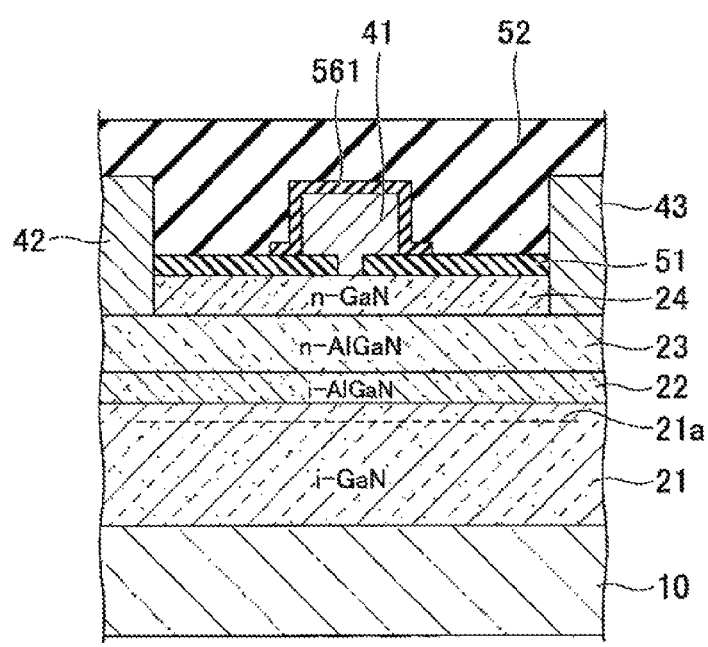

Then, as illustrated in FIG. 27B, the insulation film 52 is formed on the barrier insulation film 561 and the insulation film 51. For example, the insulation film 52 is formed by depositing (e.g., plasma CVD, sputtering) a SiN film having a film thickness of 500 nm. Accordingly, a protection film including the insulation films 51 and 52 is formed.

With the semiconductor apparatus 7 according to the above-described embodiment, eutectic between the gold included in the gate electrode 41 and the silicon included in the insulation film 52 can be prevented because the barrier insulation film 561 is formed between the gate electrode 41 and the insulation film 52. Thereby, reliability of the semiconductor apparatus 7 can be improved. That is, in this embodiment, there is no area in which the gate electrode 41 and the insulation film 52 directly contact each other because the top and side surfaces of the gate electrode 41 is covered by the barrier insulation film 561. Accordingly, the formation of gold-silicon eutectic can be prevented. As a result, a highly reliable semiconductor apparatus 7 can be manufactured.

Eighth Embodiment

Semiconductor Apparatus

Figure 28:
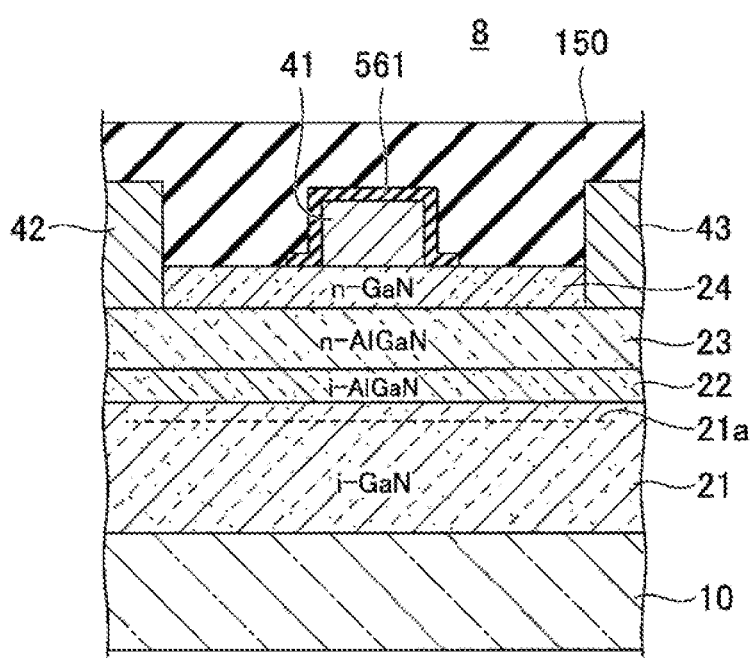
FIG. 28 is a schematic diagram illustrating a configuration of a semiconductor apparatus according to the eighth embodiment of the present invention.

Next, a semiconductor apparatus 8 according to the eighth embodiment of the present invention is described with reference to FIG. 28. In the eighth embodiment, like components are denoted by like reference numerals as of those of the first-seventh embodiments and are not further explained.

The semiconductor apparatus 8 according to the eighth embodiment is also a HEMT. In the semiconductor apparatus 8, the buffer layer (not illustrated) is formed on a surface of the substrate 10 made of, for example, a semiconductor material. A semiconductor layer having a layered configuration including the electron transit layer 21, the spacer layer 22, the electron supply layer 23, and the cap layer 24 is formed on the buffer layer by epitaxial growth. Thereby, the secondary electron gas (2DEG) 21a is formed in a part of the electron transit layer 21 on a side toward the electron supply layer 23. Further, the gate electrode 41, which contacts the cap layer, is formed in a predetermined region of the cap layer 24. In this embodiment, the source electrode 42 and the drain electrode 43 are formed in contact with the electron supply layer 23. However, alternatively, the source electrode 42 and the drain electrode 43 may be formed in contact with the electron transit layer 21.

The barrier insulation film 561 is formed on the top and side surfaces of the gate electrode 41. The protection film 150 including an insulating material (film) is formed on, for example, the barrier insulation film 561, the cap layer 24, the source electrode 42, and the drain electrode 43. By forming the barrier insulation film 561 between the gate electrode 41 and the protection film 150, the gold included in the gate electrode 41 and the silicon included in the protection film 150 can be prevented from contacting each other. Thereby, the formation of gold-silicon eutectic can be prevented. As a result, a highly reliable semiconductor apparatus 8 can be manufactured.

(Method for Manufacturing Semiconductor Apparatus)

Next, a method for manufacturing the semiconductor apparatus 8 according to the eighth embodiment of the present invention is described with reference to FIGS. 29A-30C.

Figure 29A:
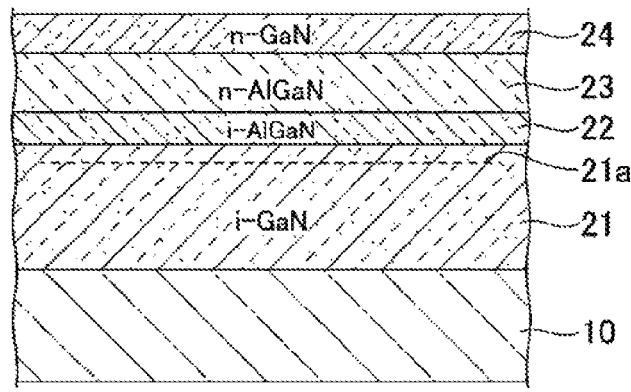
FIG. 29A-30C are schematic diagrams for describing a method for manufacturing the semiconductor apparatus according to the eighth embodiment of the present invention.

As illustrated in FIG. 29A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, the electron supply layer (second semiconductor layer) 23, and the cap layer 24 in this order. Then, although not illustrated in the drawings, the device isolation area is formed.

Figure 29B:
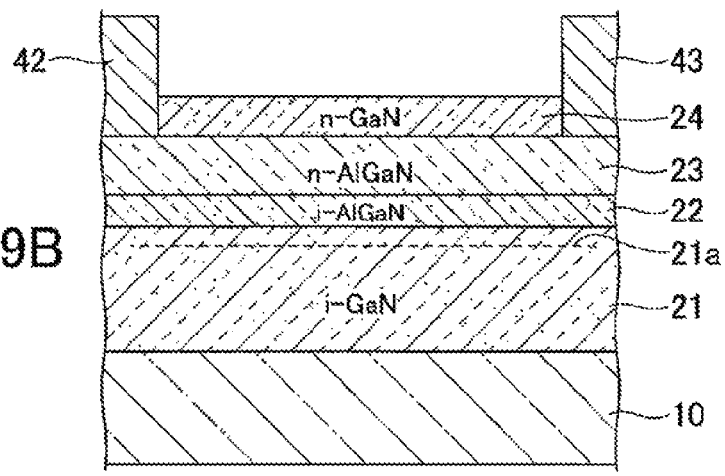

Then, as illustrated in FIG. 29B, the source electrode 42 and the drain electrode 43 are formed on the cap layer 24. For example, in forming the source electrode 42 and the drain electrode 43, first, photoresist is applied on the cap layer 24. Then, the photoresist is exposed and developed. Thereby, a resist pattern (not illustrated) having openings corresponding to regions where the source electrode 42 and the drain electrode 43 are to be formed. Then, dry-etching such as RIE (Reactive Ion Etching) is performed on the resist pattern for removing parts of the cap layer 24 corresponding to regions where the resist pattern is not formed. Thereby, the surface of the electron supply layer 23 is exposed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed. After the lift-off, ohmic contact can be achieved by performing a thermal process in a temperature of 550° C.

Figure 29C:
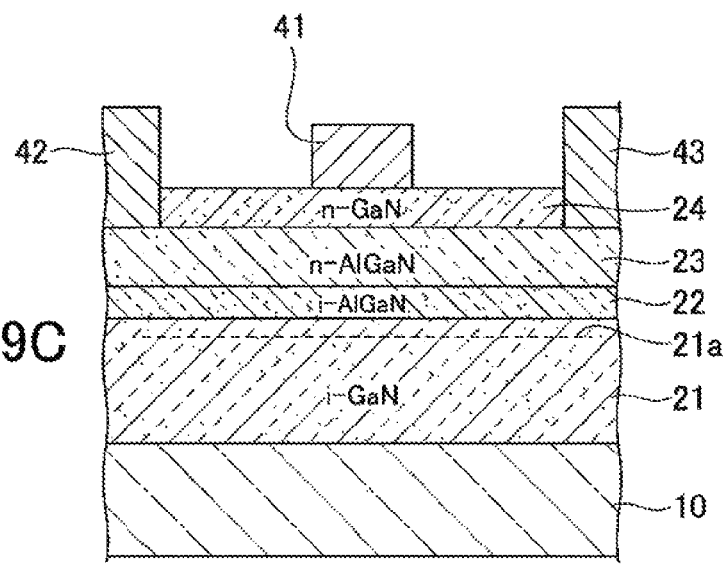

Then, as illustrated in FIG. 29C, the gate electrode 41 is formed on the cap layer 24. For example, in forming the gate electrode 41, first, photoresist is applied to the cap layer 24. Then, the photoresist is exposed and developed. Thereby, a resist pattern (not illustrated) including an opening area is formed in a region in which the gate electrode 41 is to be formed. Then, a metal film having a layered configuration including Ni/Au (Ni: 10 nm, Au: 400 nm) is deposited on entire surface of the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed.

Figure 30A:
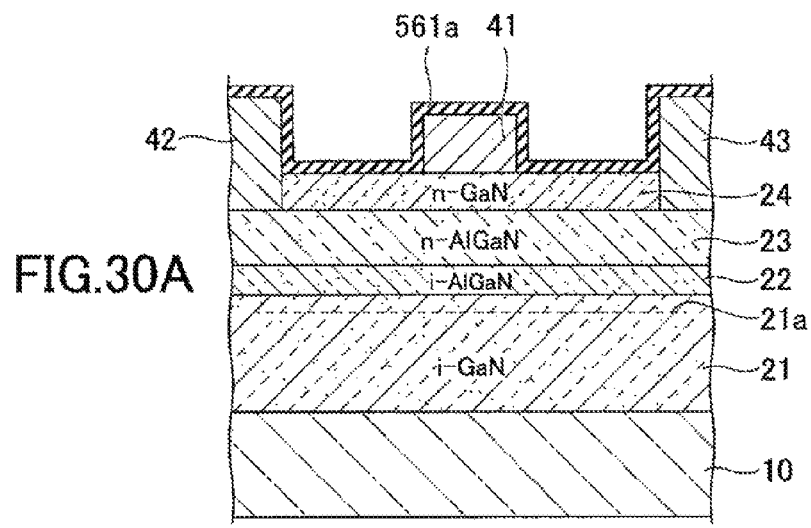

Then, as illustrated in FIG. 30A, the insulation film 561a is formed on the top and side surfaces of the gate electrode 41 and on the cap layer 24. The insulation film 561a, which is to become the barrier insulation film 561, is formed by depositing (e.g., sputtering) an oxide aluminum film having a film thickness of approximately 20 nm.

Figure 30B:
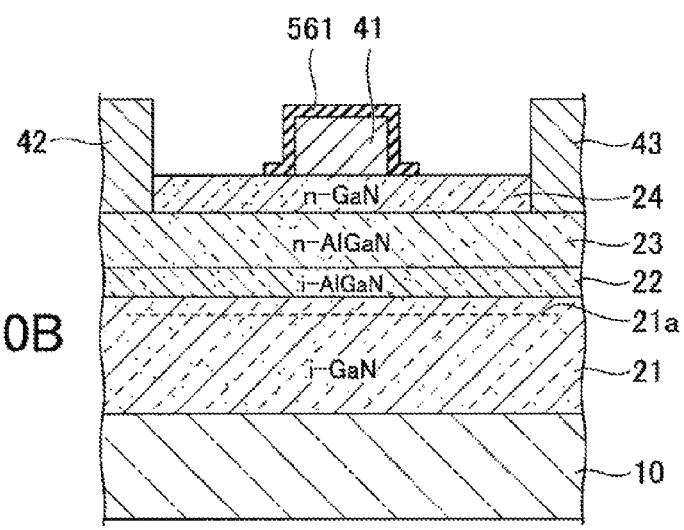

Then, as illustrated in FIG. 30B, the barrier insulation film 561 is formed in a manner covering the top and side surfaces of the gate electrode 41. For example, in forming the barrier insulation film 561, first, photoresist is applied to the insulation film 561a. Then, the photoresist is exposed and developed. Thereby, a resist pattern (not illustrated) is formed. The resist pattern has the photoresist remaining on the top and side surfaces of the gate electrode 41 and includes an opening area formed on, for example, the surface of the cap layer 24. Then, wet-etching using TMAH (Tetra-Methyl Ammonium Hydroxide) is performed on the resist pattern for removing parts of the insulation film 561a corresponding to regions where the resist pattern is not formed. Then, the resist pattern is removed. As a result, the barrier insulation film 561 is formed by the remaining insulation film 561a. The resist pattern may be removed by using, for example, an organic solvent.

Figure 30C:
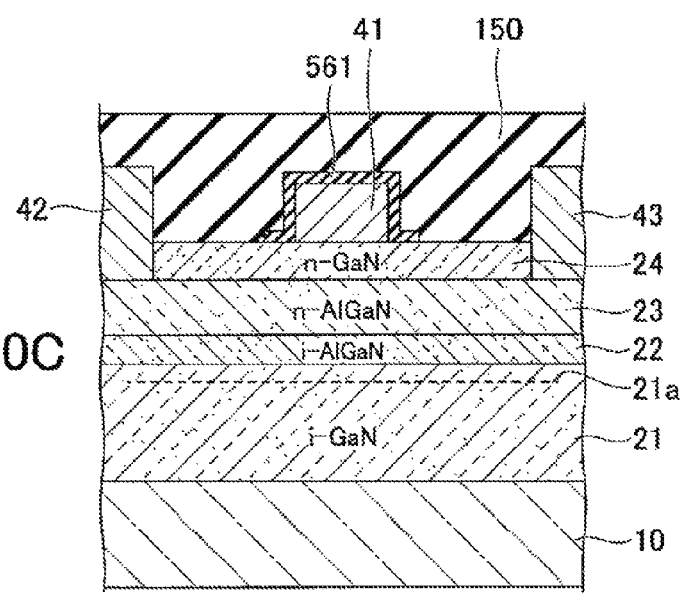

Then, as illustrated in FIG. 30C, the protection film 150 including the insulation material (film) is formed on the barrier insulation film 561 and the cap layer 24. For example, the protection film 150 is formed by depositing (e.g., plasma CVD, sputtering) a SiN film having a film thickness of 500 nm. Accordingly, the protection film 150 including the insulation material (film) is formed.

With the semiconductor apparatus 8 according to the above-described embodiment, the formation of eutectic between the gold included in the gate electrode 41 and the silicon included in the protection film 41 can be prevented because the barrier insulation film 561 is formed between the gate electrode 41 and the protection film 150. Thereby, reliability of the semiconductor apparatus 8 can be improved.

Ninth Embodiment

Semiconductor Apparatus

Figure 31:
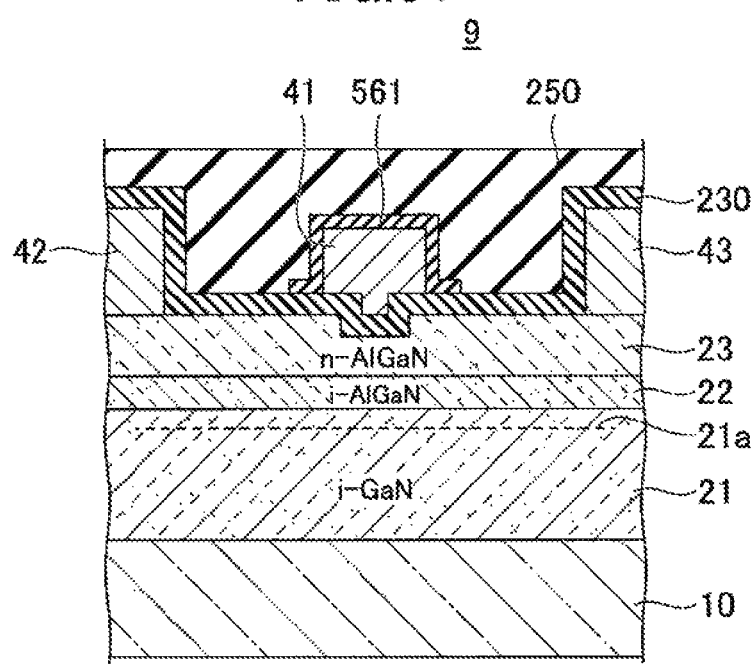
FIG. 31 is a schematic diagram illustrating a configuration of a semiconductor apparatus according to the ninth embodiment of the present invention.

Next, a semiconductor apparatus 9 according to the ninth embodiment of the present invention is described with reference to FIG. 31. In the ninth embodiment, like components are denoted by like reference numerals as of those of the first-eighth embodiments and are not further explained.

The semiconductor apparatus 9 according to the ninth embodiment is also a HEMT. In the semiconductor apparatus 9, the buffer layer (not illustrated) is formed on a surface of the substrate 10 made of, for example, a semiconductor material. A semiconductor layer having a layered configuration including the electron transit layer 21, the spacer layer 22, and the electron supply layer 23 is formed on the buffer layer by epitaxial growth. Thereby, the secondary electron gas (2DEG) 21a is formed in a part of the electron transit layer 21 on a side toward the electron supply layer 23. Further, a recess is formed in the electron supply layer 23. The insulation film 230 (which is to become a gate insulation film) made of oxide aluminum or the like is formed on the electron supply layer 23 including the bottom and the side surfaces of the recess. The gate electrode 41 is formed on a region of the electron supply layer 23 where the recess is formed via the insulation film 230. The source electrode 42 and the drain electrode 43 are formed in contact with the electron supply layer 23. Alternatively, the source electrode 42 and the drain electrode 43 may be formed in contact with the electron transit layer 21.

The barrier insulation film 561 is formed on the top and side surfaces of the gate electrode 41. The protection film 250 including an insulating material (film) is formed on, for example, the barrier insulation film 561 and the insulation film 230. By forming the barrier insulation film 561 between the gate electrode 41 and the protection film 150, the gold included in the gate electrode 41 and the silicon included in the protection film 250 can be prevented from contacting each other. Thereby, the formation of gold-silicon eutectic can be prevented. As a result, a highly reliable semiconductor apparatus 9 can be manufactured.

(Method for Manufacturing Semiconductor Apparatus)

Next, a method for manufacturing the semiconductor apparatus 9 according to the ninth embodiment of the present invention is described with reference to FIGS. 32A-34B.

Figure 32A:
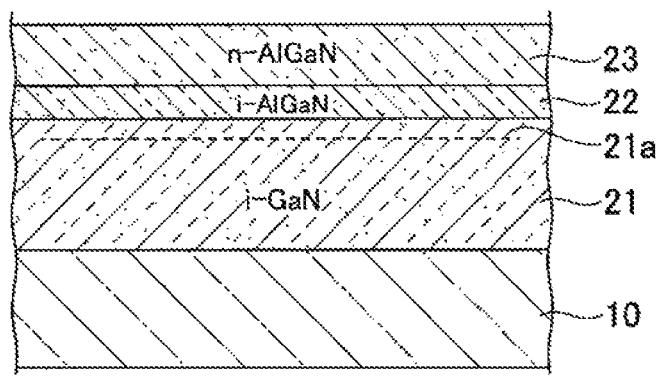
FIG. 32A-34B are schematic diagrams for describing a method for manufacturing the semiconductor apparatus according to the ninth embodiment of the present invention.

As illustrated in FIG. 32A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, and the electron supply layer (second semiconductor layer) 23 in this order. Then, although not illustrated in the drawings, the device isolation area is formed.

Figure 32B:
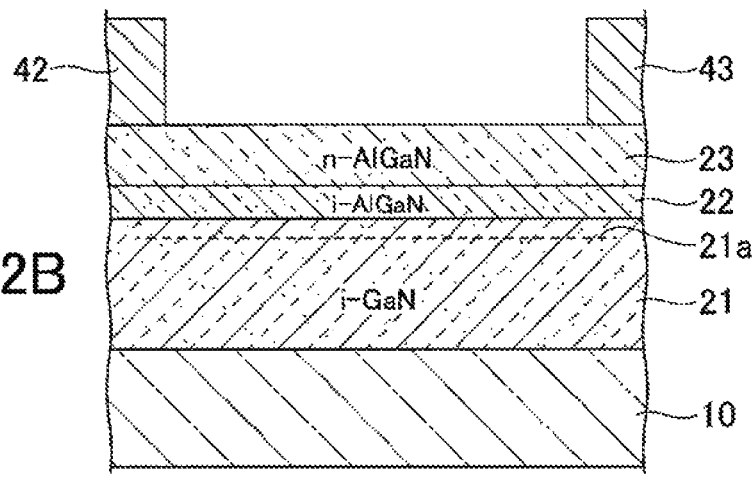

Then, as illustrated in FIG. 32B, the source electrode 42 and the drain electrode 43 are formed on the electron supply layer 23. For example, in forming the source electrode 42 and the drain electrode 43, first, photoresist is applied on the electron supply layer 23. Then, the photoresist is exposed and developed. Thereby, a resist pattern (not illustrated) having openings corresponding to regions where the source electrode 42 and the drain electrode 43 are to be formed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 32C:
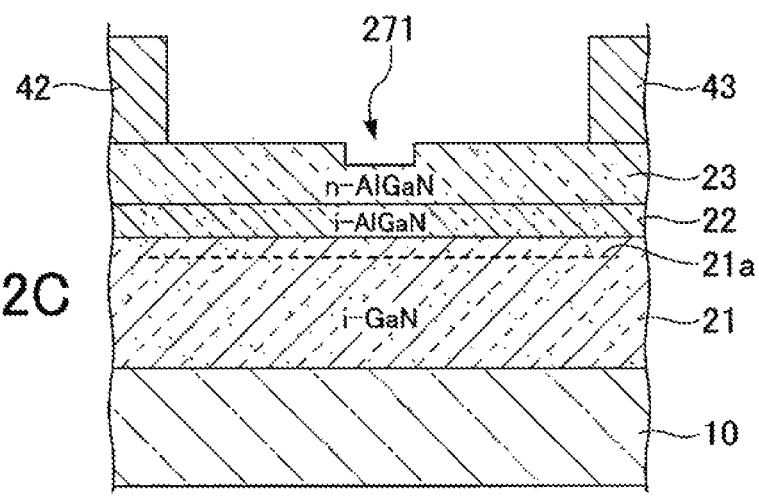

Then, as illustrated in FIG. 32C, the recess 271 is formed in the electron supply layer 23. For example, in forming the recess 271, photoresist is applied to the electron supply layer 23. Then, the photoresist is exposed and developed. Thereby, a resist pattern (not illustrated) including an opening area is formed in a region in which the recess 271 is to be formed. Then, a part of or all of the electron supply layer 23 located at the opening area of the resist pattern (not illustrated) is removed by dry-etching (e.g., RIE) using a chlorine type gas. Thereby, the recess 271 is formed in the electron supply layer 23. Then, the resist pattern may be removed by using, for example, an organic solvent.

Figure 33A:
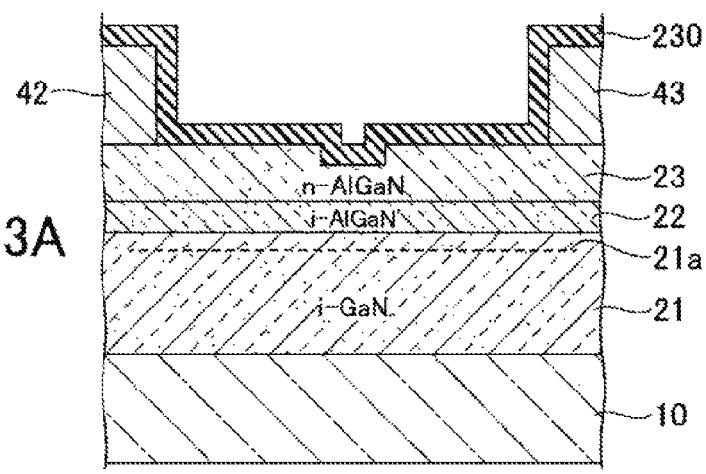

Then, as illustrated in FIG. 33A, the insulation film (which is to become the gate insulation film) 230 is formed on the surface of the electron supply layer 23 including an inner surface of the recess 27. For example, the insulation film 230 is formed by depositing (e.g., ALD, sputtering) an aluminum oxide having a film thickness ranging from 2 nm to 200 nm (e.g., 20 nm).

Figure 33B:
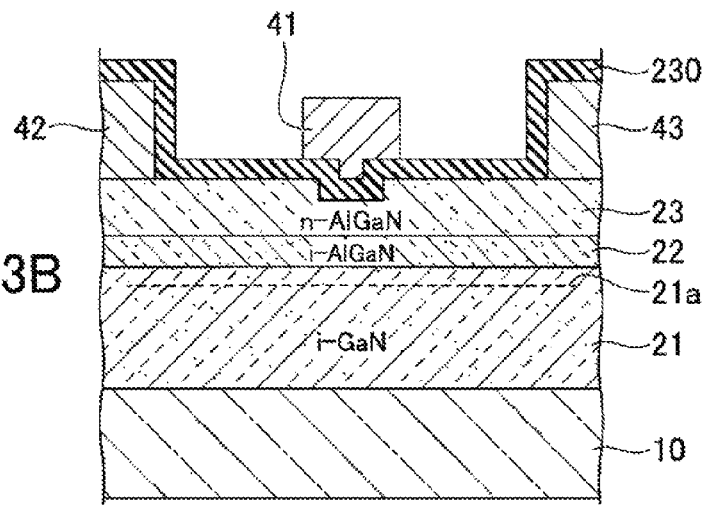

Then, as illustrated in FIG. 33B, the gate electrode 41 and the gate electrode protection film 60 are formed in the region of the insulation film 230 where the recess 271 is formed. For example, in forming the gate electrode 41 and the gate electrode protection film 60, first, photoresist is applied to the insulation film 230. Then, the photoresist is exposed and developed. Thereby, a resist pattern (not illustrated) including an opening area is formed in a region in which the gate electrode 41 is to be formed. Then, a metal film having a layered configuration including Ni/Au/Ti (Ni: 10 nm, Au: 400 nm, Ti: 20 nm) is deposited entirely on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed in an area including the region where the recess 271 is formed via the insulation film 230.

Figure 33C:
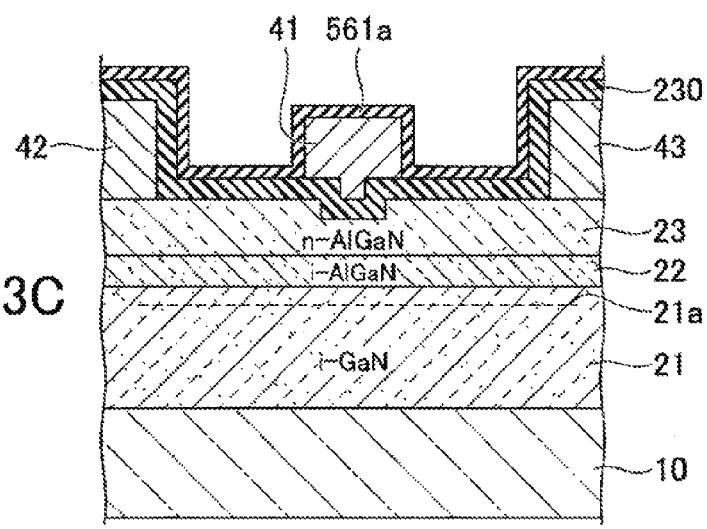

Then, as illustrated in FIG. 33C, the insulation film 561a is formed on the entire surface (including the top and side surfaces) of the gate electrode 41. The insulation film 561a, which is to become the barrier insulation film 561, is formed by depositing (e.g., sputtering) an oxide aluminum film having a film thickness of approximately 20 nm.

Figure 34A:
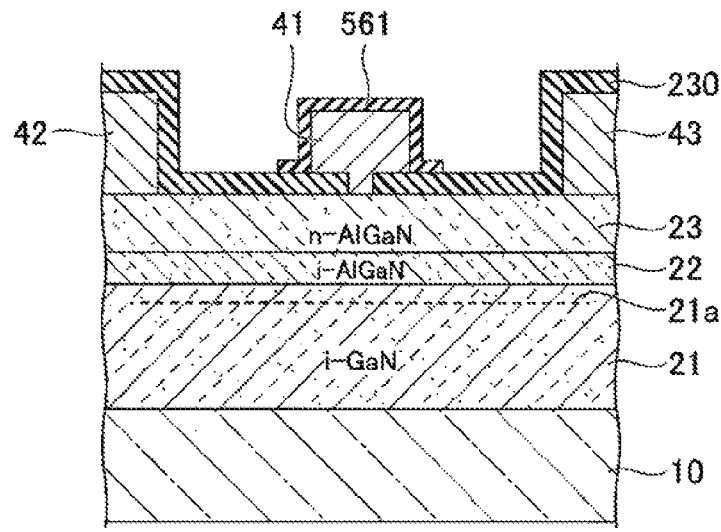

Then, as illustrated in FIG. 34A, the barrier insulation film 561 is formed in a manner covering the top and side surfaces of the gate electrode 41. For example, in forming the barrier insulation film 561, first, photoresist is applied to the insulation film 561a. Then, the photoresist is exposed and developed. Thereby, a resist pattern (not illustrated) is formed. The resist pattern is formed in a region in which the barrier insulation film 561 is to be formed. That is, the resist pattern has the photoresist remaining on the top and side surfaces of the gate electrode 41 and includes an opening area formed on, for example, the surface of the insulation film 230. Then, wet-etching using TMAH is performed on the resist pattern for removing parts of the insulation film 561a corresponding to regions where the resist pattern is not formed. Then, the resist pattern is removed. As a result, the barrier insulation film 561 is formed by the remaining insulation film 561a. The resist pattern may be removed by using, for example, an organic solvent.

Figure 34B:
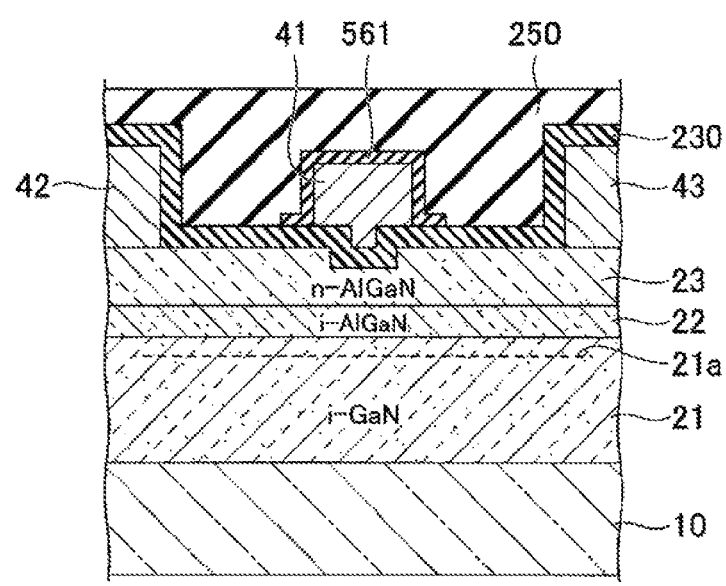

Then, as illustrated in FIG. 34B, the protection film 250 including the insulation material (film) is formed on the barrier insulation film 561 and the insulation film 230 (which is to become the gate insulation film). For example, the protection film 250 is formed by depositing (e.g., plasma CVD, sputtering) a SiN film having a film thickness of 500 nm. Accordingly, the protection film 250 including the insulation material (film) is formed.

With the semiconductor apparatus 9 according to the above-described embodiment, the formation of eutectic between the gold included in the gate electrode 41 and the silicon included in the protection film 41 can be prevented because the barrier insulation film 561 is formed between the gate electrode 41 and the protection film 250. Thereby, reliability of the semiconductor apparatus 9 can be improved.

Tenth Embodiment

Semiconductor Apparatus

Figure 35:
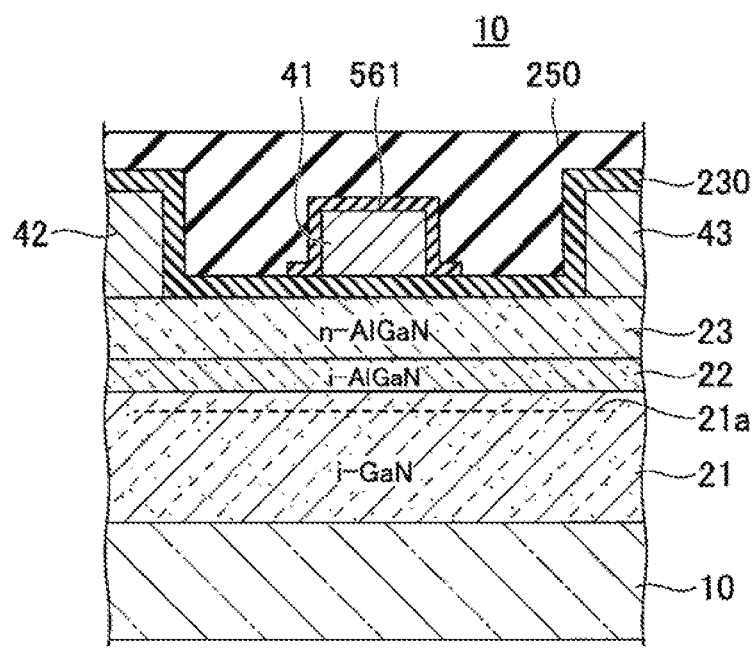
FIG. 35 is a schematic diagram illustrating a configuration of a semiconductor apparatus according to the tenth embodiment of the present invention.

Next, a semiconductor apparatus 10 according to the tenth embodiment of the present invention is described with reference to FIG. 35. In the tenth embodiment, like components are denoted by like reference numerals as of those of the first-ninth embodiments and are not further explained.

The semiconductor apparatus 10 according to the tenth embodiment is also a HEMT. In the semiconductor apparatus 10, the buffer layer (not illustrated) is formed on a surface of the substrate 10 made of, for example, a semiconductor material. A semiconductor layer having a layered configuration including the electron transit layer 21, the spacer layer 22, and the electron supply layer 23 is formed on the buffer layer by epitaxial growth. Thereby, the secondary electron gas (2DEG) 21a is formed in a part of the electron transit layer 21 on a side toward the electron supply layer 23. Further, a recess is formed in the electron supply layer 23. The insulation film 230 (which is to become a gate insulation film) made of oxide aluminum or the like is formed on the electron supply layer 23. The gate electrode 41 is formed on a region of the electron supply layer 23 where the recess is formed via the insulation film 230. The source electrode 42 and the drain electrode 43 are formed in contact with the electron supply layer 23. Alternatively, the source electrode 42 and the drain electrode 43 may be formed in contact with the electron transit layer 21.

The barrier insulation film 561 is formed on the top and side surfaces of the gate electrode 41. The protection film 250 including an insulating material (film) is formed on, for example, the barrier insulation film 561 and the insulation film 230. By forming the barrier insulation film 561 between the gate electrode 41 and the protection film 250, the gold included in the gate electrode 41 and the silicon included in the protection film 250 can be prevented from contacting each other. Thereby, the formation of gold-silicon eutectic can be prevented. As a result, a highly reliable semiconductor apparatus 10 can be manufactured.

(Method for Manufacturing Semiconductor Apparatus)

Next, a method for manufacturing the semiconductor apparatus 10 according to the tenth embodiment of the present invention is described with reference to FIGS. 36A-38.

Figure 36A:
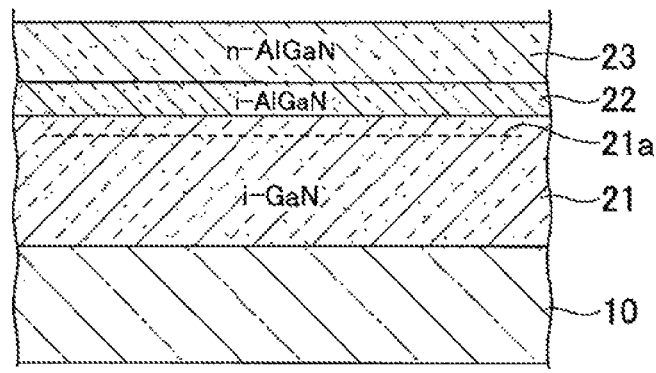
FIG. 36A-38 are schematic diagrams for describing a method for manufacturing the semiconductor apparatus according to the tenth embodiment of the present invention.

As illustrated in FIG. 36A, first, a buffer layer (not illustrated) is formed on the substrate 10 made of a material having a semiconductor property (e.g., SiC). Then, a semiconductor layer configuration is formed on the substrate 10 via the buffer layer (not illustrated). The semiconductor layer configuration is formed by forming the electron transit layer (first semiconductor layer) 21, the spacer layer 22, and the electron supply layer (second semiconductor layer) 23 in this order. Then, although not illustrated in the drawings, the device isolation area is formed.

Figure 36B:
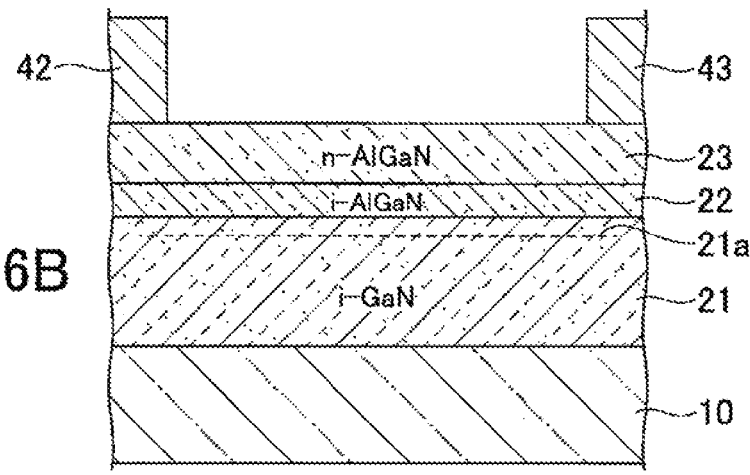

Then, as illustrated in FIG. 36B, the source electrode 42 and the drain electrode 43 are formed on the electron supply layer 23. For example, in forming the source electrode 42 and the drain electrode 43, first, photoresist is applied on the electron supply layer 23. Then, the photoresist is exposed and developed. Thereby, a resist pattern (not illustrated) having openings corresponding to regions where the source electrode 42 and the drain electrode 43 are to be formed. Then, a metal film having a layered configuration including Ta/Al (Ta: 20 nm, Al: 200 nm) is deposited on the resist pattern by using, for example, a vacuum deposition method. Then, by impregnating the resist pattern and the metal film with an organic solvent or the like and performing lift-off, the resist pattern can be removed together with the metal film. Thereby, the source and the drain electrodes 42, 43 made of Ta/Al are formed in areas where the resist pattern is not formed. After the lift-off, ohmic contact can be achieved by performing a thermal process in a temperature of 550° C.

Figure 36C:
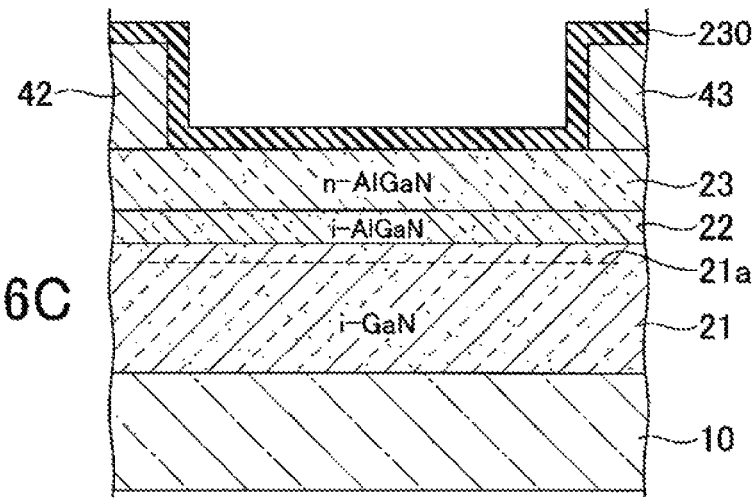

Then, as illustrated in FIG. 36C, the insulation film (which is to become the gate insulation film) 230 is formed on the surface of the electron supply layer 23. For example, the insulation film 230 is formed by depositing (e.g., ALD, sputtering) an aluminum oxide having a film thickness ranging from 2 nm to 200 nm (e.g., 20 nm).

Figure 37A:
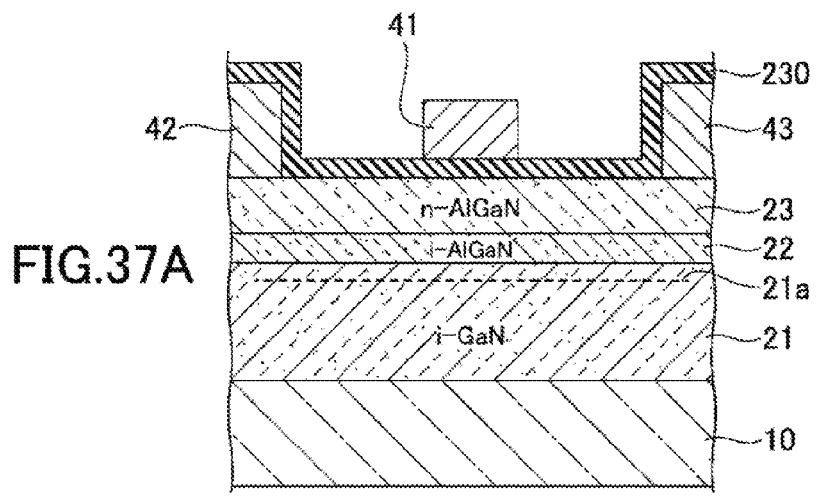

Then, as illustrated in FIG. 37A, the gate electrode 41 and the gate electrode protection film 60 are formed in the region of the insulation film 230. For example, in forming the gate electrode 41 and the gate electrode protection film 60, first, photoresist is applied to the insulation film 230. Then, the photoresist is exposed and developed. Thereby, a resist pattern (not illustrated) including an opening area is formed in a region in which the gate electrode 41 is to be formed. Then, a metal film having a layered configuration including Ni/Au (Ni: 10 nm, Au: 400 nm) is deposited entirely on the resist pattern by using, for example a vacuum deposition method. Then, by impregnating the resist pattern and the metal film with an organic solvent or the like and performing lift-off, the resist pattern can be removed together with the metal film. Thereby, the gate electrode 41 made of Ni/Au is formed in an area including the region where the recess 271 is formed via the insulation film 230.

Figure 37B:
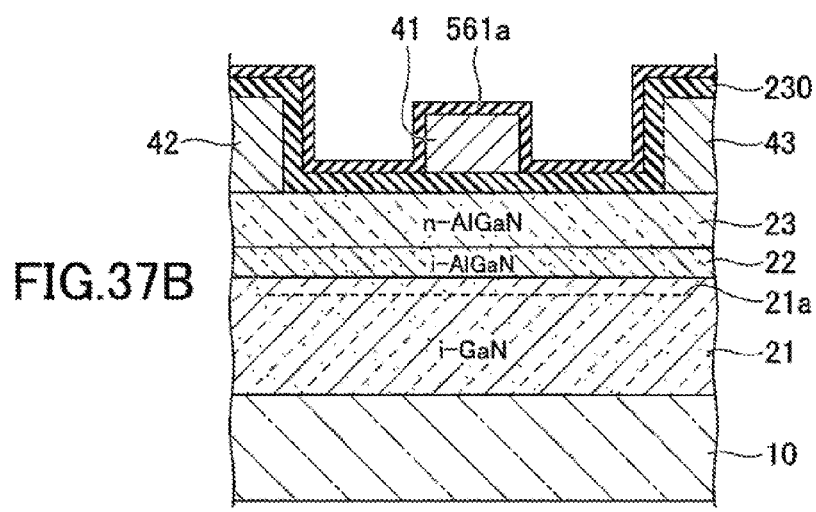

Then, as illustrated in FIG. 37B, the insulation film 561a is formed on the entire surface (including the top and side surfaces) of the gate electrode 41. The insulation film 561a, which is to become the barrier insulation film 561, is formed by depositing (e.g., sputtering) an oxide aluminum film having a film thickness of approximately 20 nm.

Figure 37C:
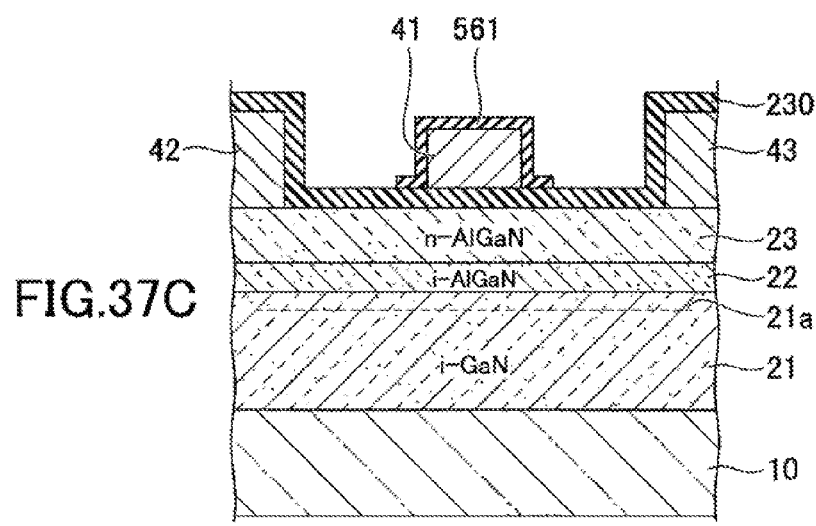

Then, as illustrated in FIG. 37C, the barrier insulation film 561 is formed in a manner covering the top and side surfaces of the gate electrode 41. For example, in forming the barrier insulation film 561, first, photoresist is applied to the insulation film 561a. Then, the photoresist is exposed and developed. Thereby, a resist pattern (not illustrated) is formed. The resist pattern is formed in a region in which the barrier insulation film 561 is to be formed. That is, the resist pattern has the photoresist remaining on the top and side surfaces of the gate electrode 41 and includes an opening area formed on, for example, the surface of the insulation film 230. Then, wet-etching using TMAH is performed on the resist pattern for removing parts of the insulation film 561a corresponding to regions where the resist pattern is not formed. Then, the resist pattern is removed. As a result, the barrier insulation film 561 is formed by the remaining insulation film 561a. The resist pattern may be removed by using, for example, an organic solvent.

Figure 38:
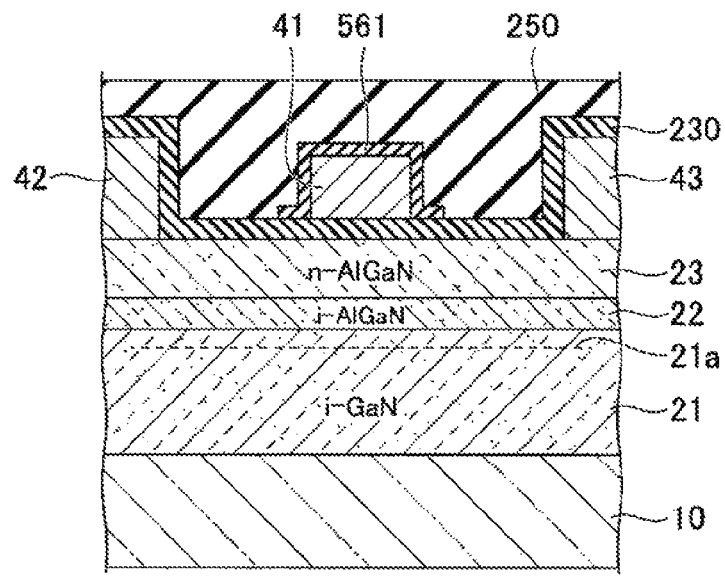

Then, as illustrated in FIG. 38, the protection film 250 including the insulation material (film) is formed on the barrier insulation film 561 and the insulation film 230 (which is to become the gate insulation film). For example, the protection film 250 is formed by depositing (e.g., plasma CVD, sputtering) a SiN film having a film thickness of 500 nm.

With the semiconductor apparatus 10 according to the above-described embodiment, the formation of eutectic between the gold included in the gate electrode 41 and the silicon included in the protection film 41 can be prevented because the barrier insulation film 561 is formed between the gate electrode 41 and the protection film 250. Thereby, reliability of the semiconductor apparatus 10 can be improved.

Eleventh Embodiment

Next, an eleventh embodiment of the present invention is described. The eleventh embodiment of the present invention may be applied to, for example, a semiconductor device, electric power device, or a high frequency amplifier. In the eleventh embodiment, like components are denoted by like reference numerals as of those of the first-tenth embodiments and are not further explained.

Figure 39:
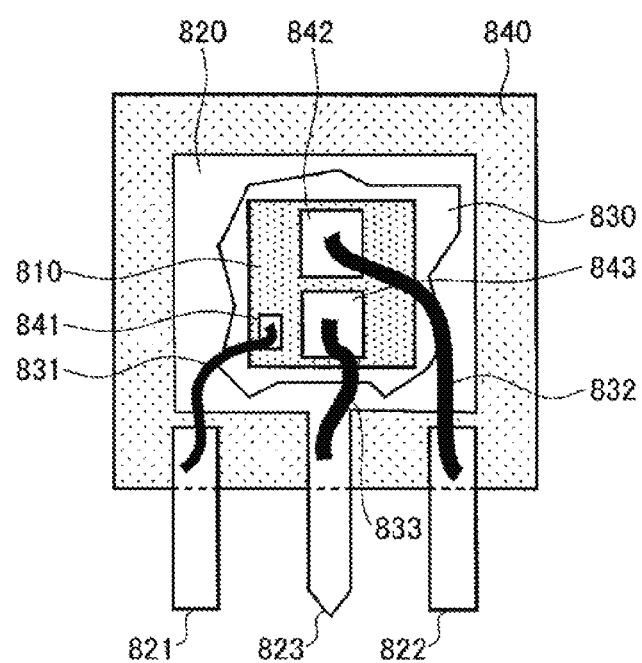
FIG. 39 is a schematic diagram for describing a discrete-packaged semiconductor device according to the eleventh embodiment of the present invention.

As one example, a semiconductor device 11 according to the eleventh embodiment of the present invention is described with reference to FIG. 39. The semiconductor device 11 may be obtained by performing discrete packaging on one of the semiconductor apparatuses 1-10 of the first-tenth embodiments of the present invention. FIG. 39 is a schematic diagram illustrating the inside of the semiconductor device 11 after being subjected to discrete packaging according to the eleventh embodiment of the present invention. It is to be noted that, for example, the arrangement of the electrodes of the semiconductor package 11 is different from the arrangement of the electrodes described in the semiconductor apparatuses 1-10 of the first-tenth embodiments of the present invention.

First, one of the semiconductor apparatus 1-10 manufactured in the first-tenth embodiments of the present invention is cut by dicing or the like. Thereby, a semiconductor chip 810 of a HEMT made of a semiconductor material (e.g., GaN type material) is obtained. Then, the semiconductor chip 810 is fixed to a lead frame 820 by using die-attach agent (e.g., solder) 803.

Then, a gate electrode 841 is connected to a gate lead 821 by a bonding wire 831, a source electrode 842 is connected to a source lead 822 by a bonding wire 832, and a drain electrode 843 is connected to a drain lead 823 by a bonding wire 833. The bonding wires 831, 832, 833 may be formed of a metal material such as aluminum (Al). In this embodiment, the gate electrode 841 is a gate electrode pad which is connected to the gate electrode 41 described in one of the first-tenth embodiments of the present invention. Likewise, the source electrode 842 is a source electrode pad which is connected to the source electrode 42 described in one of the first-tenth embodiments of the present invention. Likewise, the drain electrode 843 is a drain electrode pad which is connected to the drain electrode 43 described in one of the first-tenth embodiments of the present invention.

Then, a resin sealing process is performed on the semiconductor chip 810 by a transfer molding method using a resin molding material 840. Thereby, the manufacturing of a discrete-packaged semiconductor device 11 of a HEMT using a GaN type semiconductor material is completed.

Figure 40:
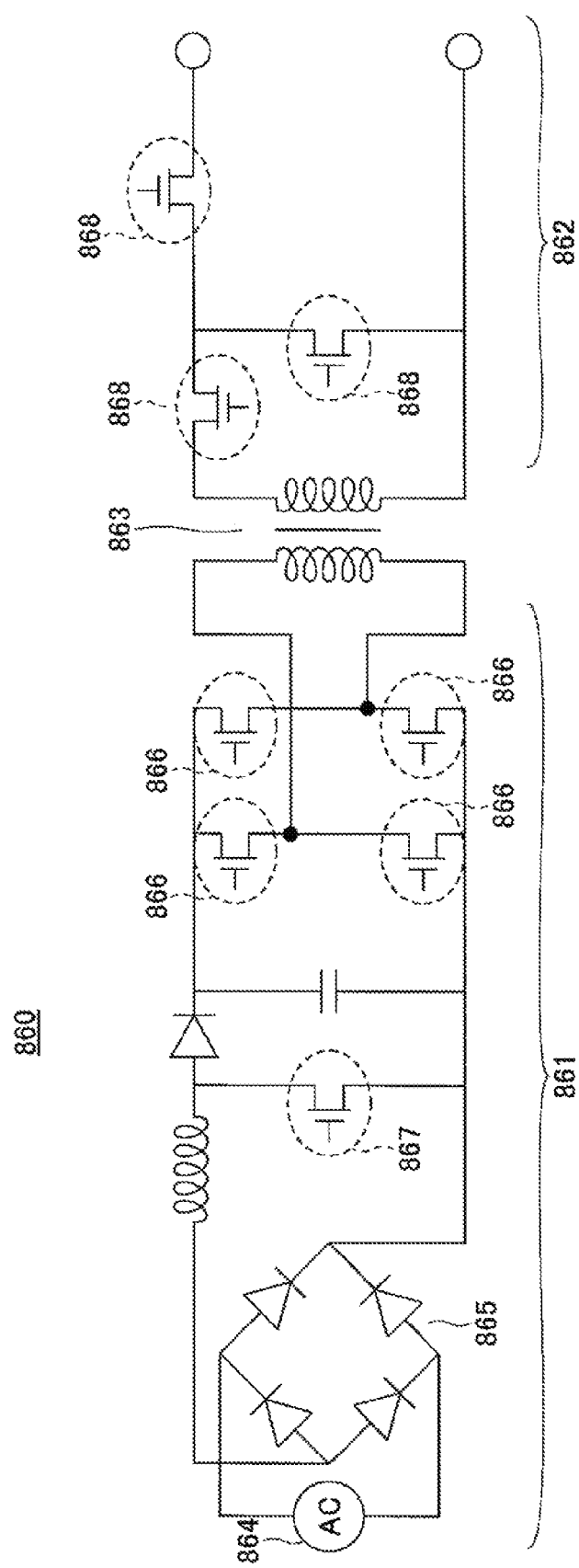
FIG. 40 is a circuit diagram illustrating a power supply device according to the eleventh embodiment of the present invention.

As another example, an electric power device 860 according to the eleventh embodiment of the present invention is described with reference to FIG. 40. The electric power device 860 uses one of the semiconductor apparatuses 1-10 of the first-tenth embodiments of the present invention. FIG. 40 is a schematic diagram illustrating the electric power device 860 according to the eleventh embodiment of the present invention. The electric power device 860 includes a first circuit 861 having a high voltage, a second circuit 862 having a low voltage, and a transformer interposed between the first and the second circuits 861, 862. The first circuit 861 includes, for example, an AC power supply 864, a bridge rectifier circuit 865, plural switching elements 866 (e.g., four switching elements 866 in FIG. 40), and one switching element 867. The second circuit 862 includes, for example, plural switching elements 868 (e.g., three switching elements 868 in FIG. 40). In the example illustrated in FIG. 40, the semiconductor apparatus 1-10 described in one of the first-tenth embodiments of the present invention is used as the switching elements 866 and 867 of the first circuit 861. It is preferable for the switching elements 866 and 867 to be a normally-off semiconductor apparatus. The switching element 868 used in the second circuit 862 a regular MISFET (Metal Insulator Semiconductor Field Effect Transistor) made of silicon.

Figure 41:
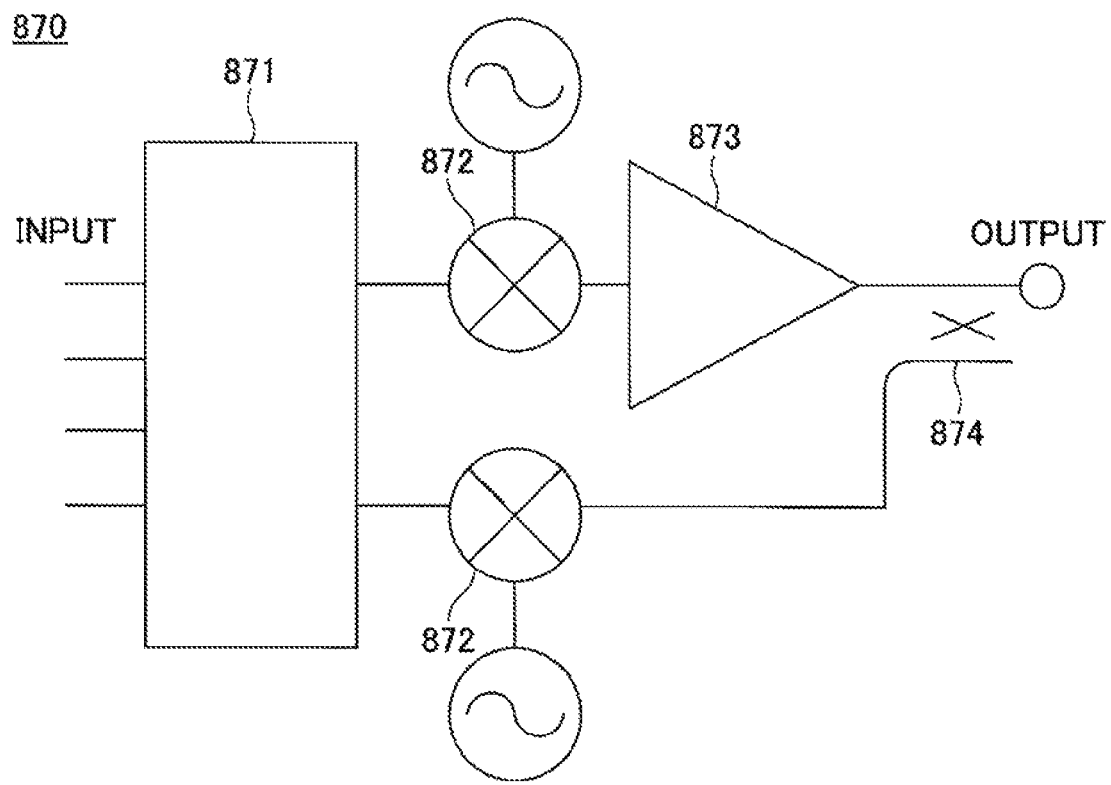
FIG. 41 is a schematic diagram illustrating a configuration of a high output amplifier according to the eleventh embodiment of the present invention.

As yet another example, a high frequency amplifier 870 according to the eleventh embodiment of the present invention is described with reference to FIG. 41. The high frequency amplifier 870 uses one of the semiconductor apparatuses 1-10 of the first-tenth embodiments of the present invention. FIG. 41 is a schematic diagram illustrating the high frequency amplifier 870 according to the eleventh embodiment of the present invention. In this embodiment, the high frequency amplifier 870 may be applied to, for example, a power amplifier of a base station of a mobile phone. The high frequency amplifier 870 includes a digital pre-distortion circuit 871, a mixer 872, a power amplifier 873, and a directional coupler 874. The digital pre-distortion circuit 871 is for compensating non-linear distortion of input signal(s). The mixer 872 is for mixing the compensated input signal and an alternating current signal. The power amplifier 873 is for amplifying the input signal mixed with the alternating current signal. In the example illustrated in FIG. 41, the power amplifier 873 includes the semiconductor apparatus 1-10 described in one of the first-tenth embodiments of the present invention. The directional coupler 874 is for performing, for example, monitoring of input and output signals. In the circuit illustrated in FIG. 41, signals can be output to the pre-distortion circuit 871 by switching and mixing the signals with the mixer 872.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus comprising:
a substrate;
a semiconductor layer formed above the substrate and including a nitride semiconductor;
an electrode formed above the semiconductor layer and including gold;
a barrier film formed above the electrode; and
a protection film formed above the semiconductor layer and including one of a silicon oxide film, a silicon nitride film, and a silicon oxynitride film;
wherein the protection film is formed on the barrier film;

wherein the barrier film includes a metal oxide material, a metal nitride film, or a metal oxynitride film, and wherein a metal film containing the metal oxide material, the metal nitride film, or the metal oxynitride film included in the barrier film is interposed between the barrier film and the electrode.

2. The semiconductor apparatus as claimed in claim 1, wherein the barrier film is formed on a top surface and a side surface of the electrode.

3. The semiconductor apparatus as claimed in claim 1, wherein the metal oxide material, the metal nitride film, or the metal oxynitride film included in the barrier film includes an oxide, nitride, or an oxynitride of one or more elements selected from Al, Ti, Ta, W, Mo, Hf, Ni, Zr.

4. The semiconductor apparatus as claimed in claim 1, wherein the protection film further includes silicon nitride.

5. The semiconductor apparatus as claimed in claim 1, further comprising:
   a field effect transistor including a source electrode and a drain electrode;
   wherein the electrode includes a gate electrode,
   wherein the semiconductor layer has a semiconductor layer configuration including a first semiconductor layer and a second semiconductor layer formed above the first semiconductor layer,
   wherein the source electrode and the drain electrode contact the first semiconductor layer or the second semiconductor layer.

6. The semiconductor apparatus as claimed in claim 5, further comprising:
   an insulation film formed above the second semiconductor layer;
   wherein the gate electrode is formed above the insulation film.

7. The semiconductor apparatus as claimed in claim 1, further comprising:
   a field effect transistor including a source electrode and a drain electrode; and
   an insulation film formed above the semiconductor layer;
   wherein the electrode includes a gate electrode,
   wherein the semiconductor layer has a semiconductor layer configuration including a first semiconductor layer and a second semiconductor layer formed above the first semiconductor layer,
   wherein the source electrode and the drain electrode contact the first semiconductor layer or the second semiconductor layer,
   wherein the second semiconductor layer includes a recess having an inner surface,
   wherein the insulation film is formed on the inner surface of the recess,
   wherein the gate electrode is formed in a region corresponding to the recess via the insulation film.

8. The semiconductor apparatus as claimed in claim 5, wherein the first semiconductor layer includes GaN, and the second semiconductor layer includes AlGaN.

9. A power supply device comprising:
   the semiconductor apparatus claimed in claim 1.

10. An amplifier comprising:
    the semiconductor apparatus claimed in claim 1.

* * * * *